(12) United States Patent
Kim et al.

(10) Patent No.: US 8,184,453 B1
(45) Date of Patent: *May 22, 2012

(54) INCREASED CAPACITY SEMICONDUCTOR PACKAGE

(75) Inventors: Jae Yoon Kim, Gangdong-gu (KR); Gi Jeong Kim, Guri-si (KR); Myung Soo Moon, Gangdong-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 516 days.

This patent is subject to a terminal disclaimer.

(21) Appl. No.: 12/183,979

(22) Filed: Jul. 31, 2008

(51) Int. Cl.
*H05K 5/02* (2006.01)

(52) U.S. Cl. ........................... 361/813; 361/768

(58) Field of Classification Search ............... 174/520, 174/536, 537, 260, 261; 257/665, 666, 667, 257/668, 669, 692, 696, 713, 734; 361/813, 361/820, 767–771

See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Yuriy Semenenko
(74) *Attorney, Agent, or Firm* — Stetina Brunda Garred & Brucker

(57) ABSTRACT

Disclosed is a lead frame and a semiconductor device including the same. The lead frame is provided with a die pad, and first, second and third lands sequentially arranged on an outer circumferential edge. The lead frame can separate the first and second lands or the die pad and the first land using a plating layer formed on the lead frame as a mask, instead of using a separate mask by etching after the application of the encapsulant. As a result thereof, a plurality of lands can be formed at low cost, in comparison with a conventional method. Additionally, the first, second and third lands are exposed to the outside through a lower portion of an encapsulant, and can be surface mounted on an external device through the first, second and third lands. A plating layer formed on bottom surfaces of the first, second and third lands of the lead frame and a process for separately plating nickel (Ni)/gold (An), Ni/Pd/Au, or tin (Sn) can be omitted so as to easily surface mount the semiconductor device to the external device.

20 Claims, 22 Drawing Sheets

U.S. PATENT DOCUMENTS

| | | | |
|---|---|---|---|
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A * | 12/1992 | Gow et al. | 257/666 |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,767,566 A | 6/1998 | Suda | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,511 A | 12/1998 | Shin et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| 6,008,532 A * | 12/1999 | Carichner | 257/691 |
| RE36,773 E | 7/2000 | Nomi et al. | |
| 6,107,679 A | 8/2000 | Noguchi | |
| 6,143,981 A | 11/2000 | Glenn | |
| 6,150,709 A | 11/2000 | Shin et al. | |
| 6,157,074 A | 12/2000 | Lee | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |

| | | |
|---|---|---|
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Oloffson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,322 B2 * | 3/2004 | Lee ............... 438/123 |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,858,919 B2 | 2/2005 | Seo et al. |
| 6,867,492 B2 | 3/2005 | Auburger et al. |
| 6,876,068 B1 * | 4/2005 | Lee et al. ............. 257/676 |
| 6,878,571 B2 | 4/2005 | Isaak et al. |
| 6,897,552 B2 | 5/2005 | Nakao |
| 6,927,478 B2 | 8/2005 | Paek |
| 6,967,125 B2 | 11/2005 | Fee et al. |
| 6,995,459 B2 | 2/2006 | Lee et al. |
| 7,002,805 B2 | 2/2006 | Lee et al. |
| 7,005,327 B2 | 2/2006 | Kung et al. |
| 7,009,283 B1 * | 3/2006 | de Simone et al. ........ 257/675 |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,102,209 B1 | 9/2006 | Bayan et al. |
| 7,109,572 B2 | 9/2006 | Fee et al. |
| 7,185,426 B1 | 3/2007 | Hiner |
| 7,193,298 B2 | 3/2007 | Hong et al. |
| 7,211,471 B1 * | 5/2007 | Foster ............... 438/123 |
| 7,245,007 B1 | 7/2007 | Foster |
| 7,253,503 B1 | 8/2007 | Fusaro et al. |
| 7,687,892 B2 * | 3/2010 | Espiritu et al. ............ 257/672 |
| 7,989,933 B1 * | 8/2011 | Kim et al. ............. 257/676 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |

| | | | |
|---|---|---|---|
| 2003/0064548 A1 | 4/2003 | Isaak | |
| 2003/0073265 A1 | 4/2003 | Hu et al. | |
| 2003/0102537 A1 | 6/2003 | McLellan et al. | |
| 2003/0164554 A1 | 9/2003 | Fee et al. | |
| 2003/0168719 A1 | 9/2003 | Cheng et al. | |
| 2003/0198032 A1 | 10/2003 | Collander et al. | |
| 2004/0027788 A1 | 2/2004 | Chiu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara et al. | |
| 2004/0089926 A1 | 5/2004 | Hsu et al. | |
| 2004/0097016 A1 | 5/2004 | Yee et al. | |
| 2004/0164387 A1 | 8/2004 | Ikenaga et al. | |
| 2004/0253803 A1 | 12/2004 | Tomono et al. | |
| 2005/0199987 A1* | 9/2005 | Danno et al. | 257/672 |
| 2006/0087020 A1 | 4/2006 | Hirano et al. | |
| 2006/0157843 A1 | 7/2006 | Hwang | |
| 2006/0231939 A1 | 10/2006 | Kawabata et al. | |
| 2007/0023202 A1 | 2/2007 | Shibata | |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

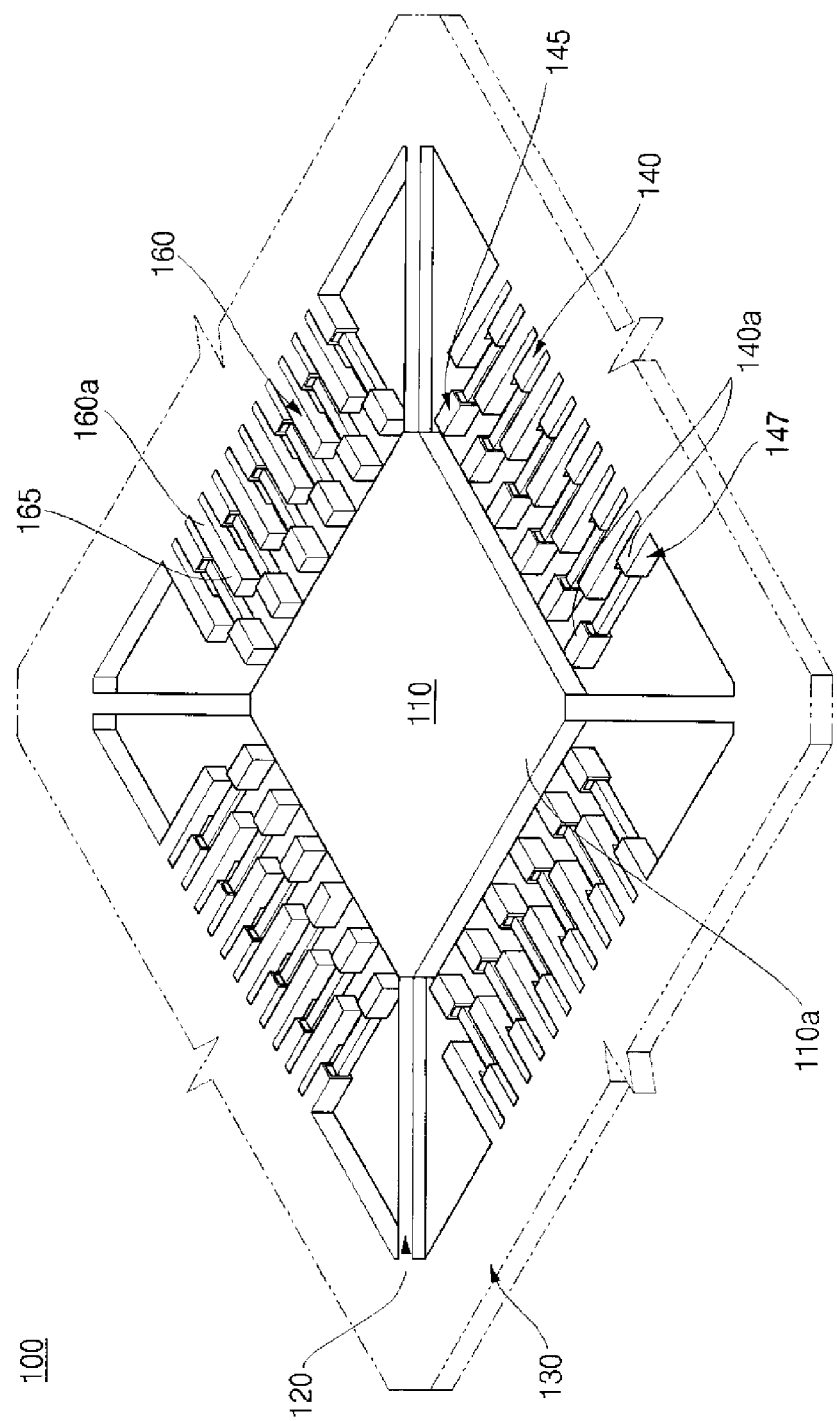

INCREASED CAPACITY SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The invention relates generally to an increased I/O lead frame and a semiconductor device incorporating the same.

2. Description of the Related Art

Generally, a lead frame for a semiconductor device is fabricated by mechanical stamping or chemical etching of metal strips. The lead frame serves to connect a semiconductor die to an external circuit and fix the semiconductor device to an external device, simultaneously.

The lead frame for the semiconductor device is generally a copper based (copper:iron:phosphorous=99.8:0.01:0.025) lead frame, a copper alloy based (copper:chrome:solder:zinc=99:0.25:0.25:0.22) lead frame, an alloy-42 based (iron:nickel=58:42) lead frame, in addition to others. The semiconductor devices using the lead frames include a through-hole mounting type dual inline package (DIP), a surface mounting type quad flat package (QFP) having smaller size and higher electrical performance, a small outline package (SOP), in addition to others.

However, in many semiconductor devices, leads of the semiconductor device are projected outwardly through a side portion of an encapsulant at a constant length. As a result, the size of the semiconductor device becomes larger and the number of input/output pins becomes smaller. In other words, though a semiconductor die may need a large number of input/output pins due to high integration and high functionality, it is difficult for the lead frame to satisfy the need of the semiconductor die.

Accordingly, in order to solve the problem, a ball grid array (BGA) or a pin grid array (PGA) semiconductor device using a laminate circuit substrate, a tape circuit substrate or a film circuit substrate has been developed in the prior art. A plurality of solder balls or metal pins of the semiconductor device are area-arrayed not in a side portion of the encapsulant, but rather in a lower portion of the encapsulant (e.g. a lower portion of a circuit substrate). As a result, a relatively large number of input/output pins can be provided.

However, the semiconductor device has high-priced circuit substrate. Additionally, heatproof performance and electrical performance of the semiconductor device are deteriorated, in comparison with a semiconductor device using a lead frame. In other words, a semiconductor die of the semiconductor device using a lead frame is often directly mounted on a die pad made of a copper material. Additionally, electric performance of semiconductor device can be improved due to high heatproof performance. However, it is difficult for the above-described semiconductor device using the circuit substrate to have the structure of the semiconductor device using the lead frame.

BRIEF SUMMARY OF THE INVENTION

In accordance with the present invention, there is provided a lead frame and a semiconductor device including the same. The lead frame is provided with a die pad, and first, second and third lands sequentially arranged on an outer circumferential edge. The lead frame can separate the first and second lands or the die pad and the first land using a plating layer formed on the lead frame as a mask, instead of using a separate mask by etching after the application of the encapsulant. As a result thereof, a plurality of lands can be formed at low cost, in comparison with a conventional method. Additionally, the first, second and third lands are exposed to the outside through a lower portion of an encapsulant, and can be surface mounted on an external device through the first, second and third lands. A plating layer formed on bottom surfaces of the first, second and third lands of the lead frame and a process for separately plating nickel (Ni)/gold (An), or tin (Sn) can be omitted so as to easily surface mount the semiconductor device to the external device. The present invention will be more apparent from the following detailed description taken in conjunction with the accompanying drawings.

BRIEF DESCRIPTION OF THE DRAWINGS

These, as well as other features of the present invention, will become more apparent upon reference to the drawings wherein:

FIG. 1A is a top perspective view illustrating a lead frame according to one exemplary embodiment of the present invention;

Common reference numerals are used throughout the drawings and the detailed description to indicate the same elements.

DETAILED DESCRIPTION OF THE INVENTION

Figure 1B:
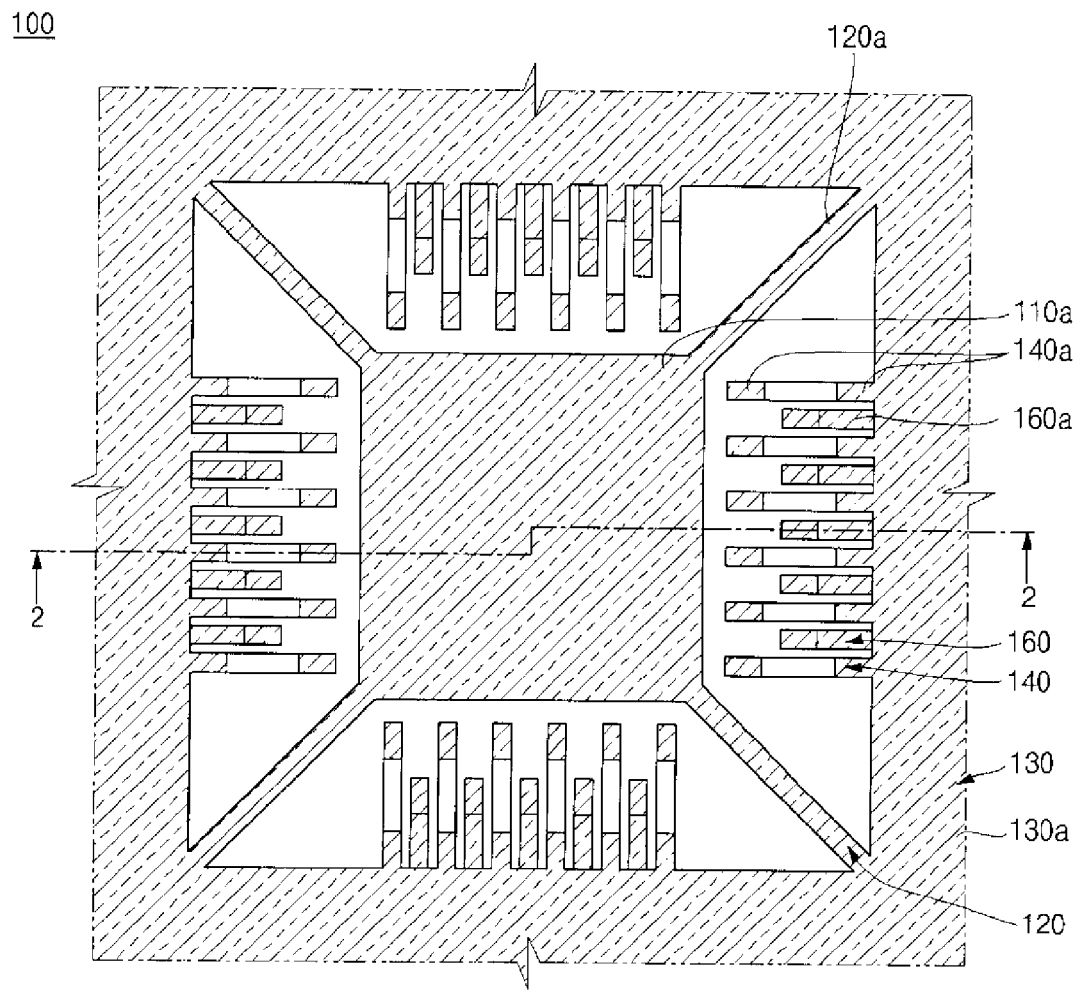
FIG. 1B is a bottom plan view of the lead frame of FIG. 1A subsequent to the formation of a plating layer thereon.
Figure 1C:
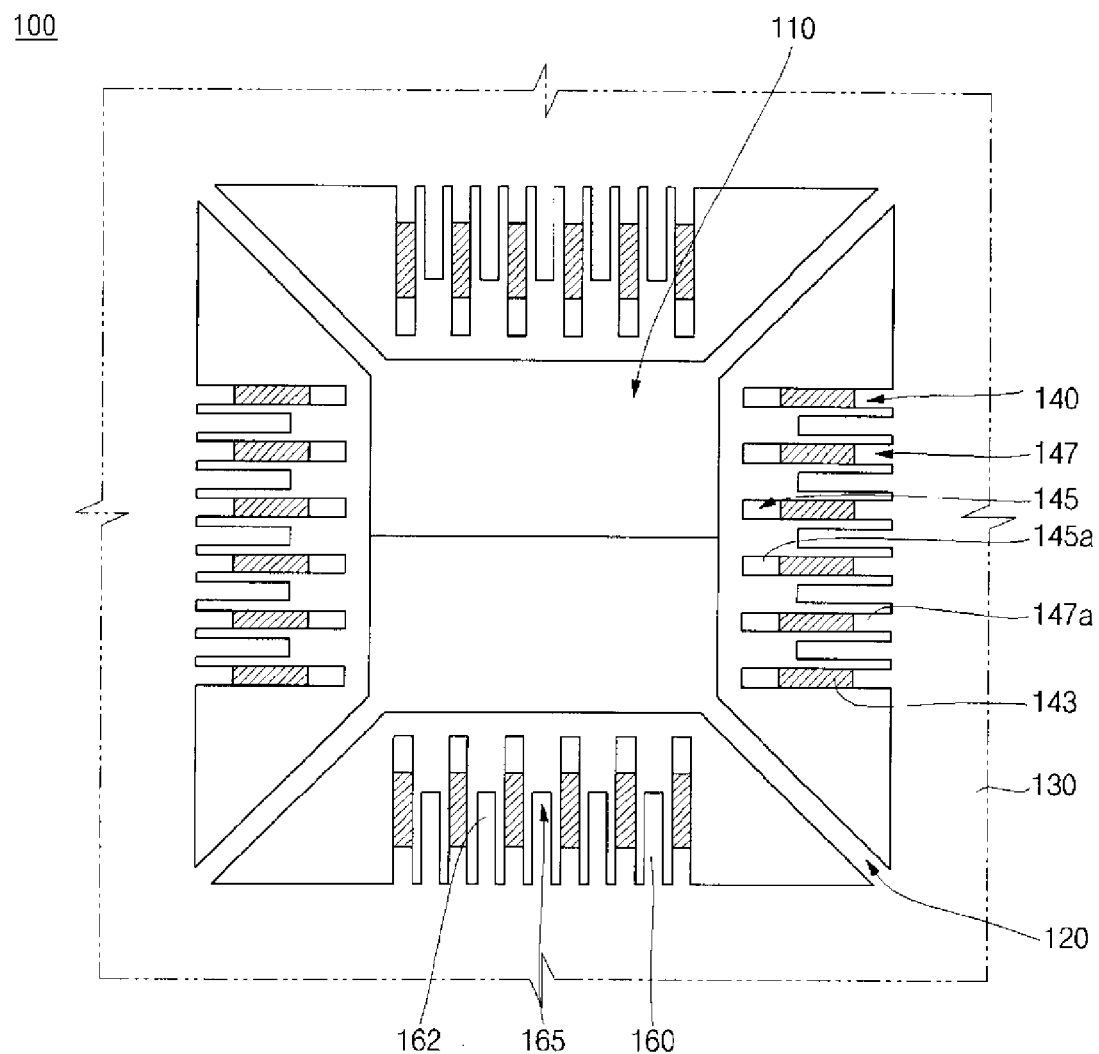
FIG. 1C is a top plan view illustrating the lead frame of FIG. 1A prior to the formation of a plating layer thereon.
Figure 1D:
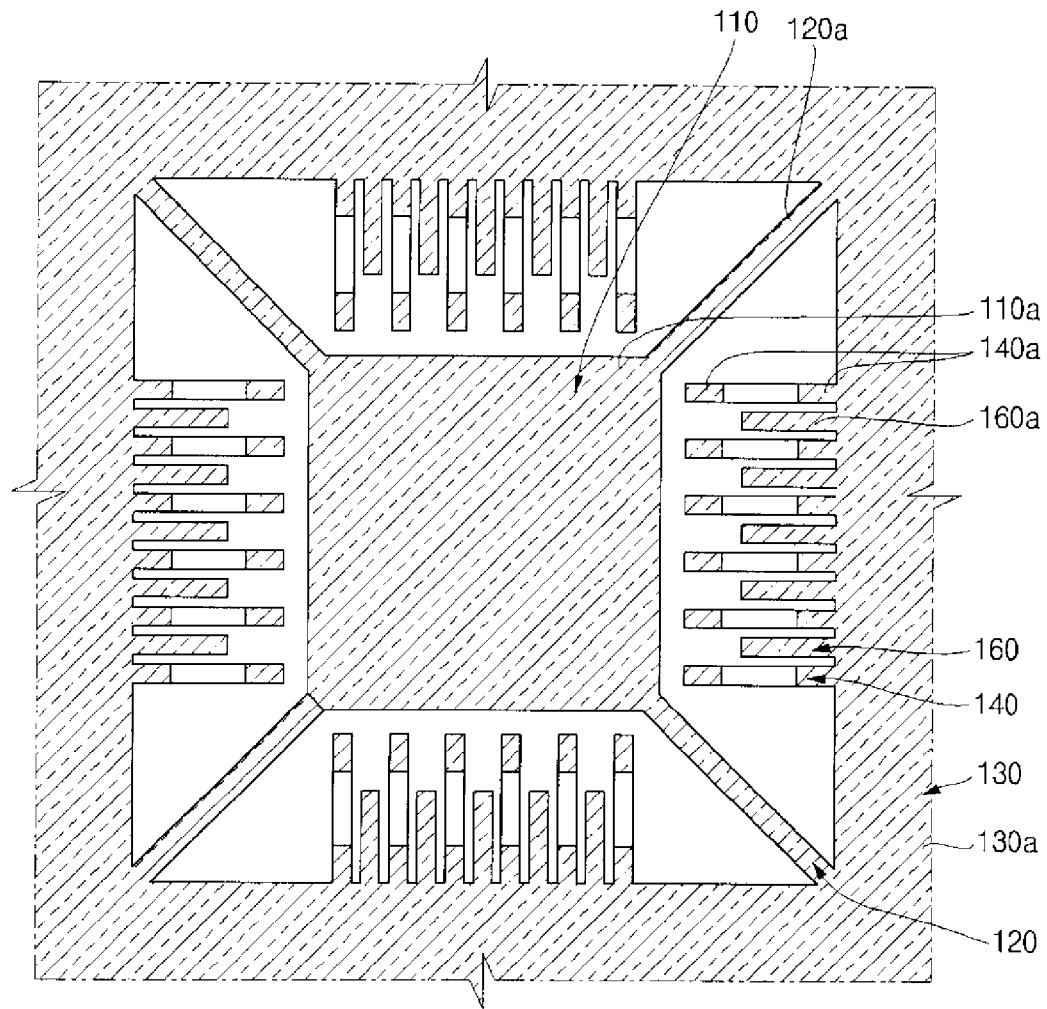
FIG. 1D is a top plan view of the lead frame of FIG. 1A subsequent to the formation of a plating layer thereon.
Figure 1E:
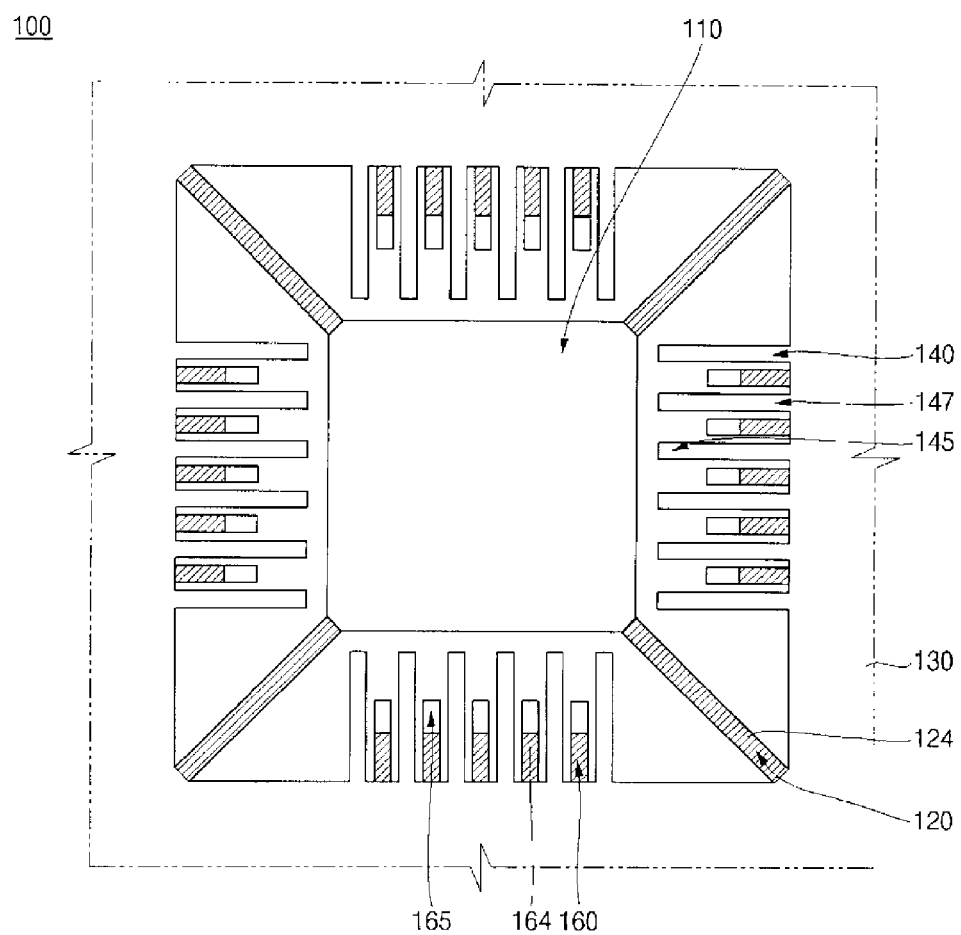
FIG. 1E is a bottom view illustrating the lead frame of FIG. 1A prior to the formation of a plating layer thereon.

Referring now to the drawings wherein the showings are for purposes of illustrating various embodiments of the present invention only, and not for purposes of limiting the same, FIG. 1A depicts a lead frame 100 according to one exemplary embodiment of the present invention.

As shown in FIGS. 1A to 1E, the lead frame 100 includes a die pad 110, a plurality of tie bars 120 formed on the die pad 110, a frame 130 connecting the tie bars 120 to each other, a plurality of extended leads 140 formed on the frame 130 and a plurality of normal leads 160 formed on the frame 130.

The die pad 110 has an approximately quadrangular plate shape with four sides and four corners. A semiconductor die is attached to the die pad 110 via an adhesive coating applied to the die pad 110. The die pad 110 is exposed to a lower portion of an encapsulant of the semiconductor device into which the lead frame 100 is integrated. In other words, the die pad 110 is surface-mounted on an external device. A plating layer 110a may be formed on the top and bottom surfaces of the die pad 110 using any one material selected from silver (Ag), a pre-plated frame (PPF) (e.g. a plating layer plated sequentially with nickel (Ni), palladium (Pd) and gold (Au)), solder (Sn) or equivalent materials. The plating layer 110a is hatched in FIGS. 1B and 1D. Additionally, the plating layer 110a may be formed on a side surface of the die pad 110.

Tie bars 120 are projected outwardly from each of the four corners of the die pad 110 at a constant length. In other words, each tie bar 120 is extended outwardly from a respective corner of the die pad 110 along an imaginary diagonal line. A half etching portion 124 is formed on a bottom surface of each tie bar 120. The half etching portion 124 is positioned in an inner side of the encapsulant in the fabricating process for a semiconductor device including the lead frame 100, and thus the bonding or adhesion force between the die pad 110 and the encapsulant is increased in the semiconductor device. A plating layer 120a may be formed on the top and bottom surfaces of each tie bar 120. The plating layer 120a may be made of the same material as that of the plating layer 110a. Thus, the detailed explanation of the material will be omitted. The plating layer 120a is hatched in FIGS. 1B and 1D. Additionally, the plating layer 120a may be formed on a side surface of each tie bar 120.

The frame 130 connects respective ends of the tie bars 120 to each other and fixes the die pad 110 through the tie bars 120. The frame 130 may be formed to extend in spaced, generally parallel relation to respective sides of the die pad 110. However, the frame 130 is ultimately separated or removed from the tie bars 120, the extended leads 140 and the normal leads 160 in the fabricating process of the semiconductor device so as to separate or electrically isolate the extended leads 140 from the normal leads 160. A plating layer 130a may be formed on the top and bottom surfaces of the frame 130. The plating layer 130a may be made of the same material as that of the layer 110a. Thus, the detailed explanation of the material will be omitted. The plating layer 130a is hatched in FIGS. 1B and 1D. Additionally, the plating layer 130a may be formed on a side surface of the frame 130.

The extended leads 140 with a predetermined pitch are extended perpendicularly from the frame 130 toward the die pad 110 at a constant length. However, the extended leads 140 do not contact the die pad 110. Additionally, the extended leads 140 are provided with a first land 145 and a second land 147, and a half etched portion 143 formed on a top surface between the first and second lands 145 and 147. The half etched portion 143 is removed to separate the first land 145 electrically from the second land 147 in the fabricating process of the semiconductor device integrating the lead frame 100. Additionally, the half etched portion 143 is hatched in FIG. 1C.

Bottom surfaces of the first and second lands 145 and 147 are areas exposed to a lower portion of the encapsulant of the semiconductor device into which the lead frame 100 is integrated. The first and second lands 145 and 147 may be surface-mounted to an external device. Additionally, wire bonding area 145a and 147a are provided on top surfaces of the extended leads 140. The wire bonding areas 145a and 147a are formed on the top surface 145a of the first land 145 of each of the extended leads 140 and the top surface 147a of the second land 147 of each of the extended leads 140, respectively. Of course, the wire bonding areas 145a, 147a, though being explained below, are areas for electrically bonding conductive wires. A plating layer 140a is formed on the top and bottom surfaces of the first and second lands 145 and 147 of the extended leads 140. The plating layer 140a may be made of the same material as that of the plating layer 110a, and thus the explanation of the material is omitted. The plating layer 140a is hatched in FIGS. 1B and 1D. Additionally, the plating layer 140a may be formed on a side surface of each of the extended leads 140 and side surfaces of the first and second lands 145 and 147.

The normal leads 160 with a predetermined pitch are each extended perpendicularly from the frame 130 toward the die pad 110 at a constant length. However, each of the normal leads 160 has the length shorter than that of the extended leads 140. In other words, the extended leads 140 and the normal leads 160 are alternately positioned relative to each other, and the length of the extended leads 140 is longer than that of the normal leads 160.

Each normal lead 160 is provided with a third land 165, and a half etched portion 164 is formed on a bottom surface between the third land 165 and the frame 130. A bottom surface of the third land 165 is exposed to a lower portion of the encapsulant of the semiconductor device into which the lead frame 100 is integrated and surface mounted to an external device.

Additionally, a wire bonding area 162 is provided on a top surface of each normal lead 160. Of course, the wire bonding area 162 is an area electrically bonding conductive wires. The detailed explanation appears below. A plating layer 160a is formed on the top and bottom surfaces of each of the normal leads 160. The plating layer 160a may be made of the same material as that of the plating layer 110a, and the explanation for the material will be omitted. The plating layer 160a is hatched in FIGS. 1B and 1D. Additionally, the plating layer 160a may be formed on a side surface of each of the normal leads 160.

The lead frame 100 according to the present invention, as a quad flat no-lead (QFN) package, has high heatproof performance for emitting heat generated from a semiconductor die mounted to the die pad 110 to the outside, and high electrical performance due to a short path for electrically transmitting a signal. Additionally, a downset is not formed on the lead frame 100 and thus a step is not formed therein. As a result, the size and thickness of a semiconductor device including the lead frame 100 can be reduced, in comparison with a conventional lead frame package. The lead frame 100 can be fabricated by etching the half etched portion 143 in the fabricating process of the semiconductor device and separating a plurality of first and second lands 145 and 147 electrically from each other. The above-described lead frame 100 can form a plurality of lands at low fabricating cost in comparison with a conventional fabricating method.

Figure 2:
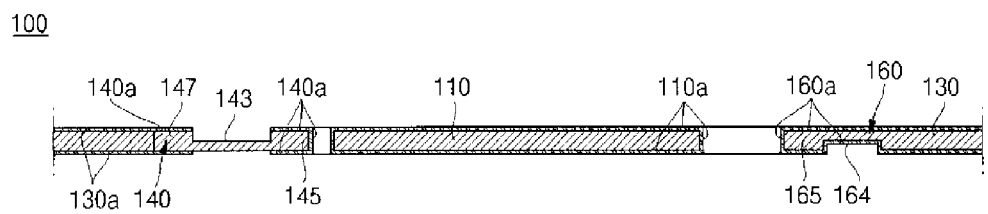
FIG. 2 is a cross-sectional view taken along a line 2-2 of FIG. 1B.

As shown in FIG. 2, a plating layer 110a is formed on a bottom surface of the die pad 110. The plating layer 110a formed on the bottom surface of the die pad 110 is exposed to a lower portion of an encapsulant of a semiconductor device into which the lead frame is integrated. In other words, the die pad 110 is surface-mounted on an external device through the plating layer 110a. Additionally, the plating layer 110a improves the electrical property between the lead frame 100 and the external device when the die pad 110 is surface mounted to the external device. The plating layer 110a may be further formed on the upper and side surfaces of the die pad 110.

Additionally, each extended lead 140 with a predetermined pitch extends outwardly from the die pad 110, and is provided with the first and second lands 145 and 147, and the half etch portion 143 between the first and second lands 145 and 147 on the top surface thereof. The plating layer 140a is formed on the top surfaces of the first and second lands 145 and 147 of the extended lead 140 for wire-bonding with a semiconductor die in the fabricating process of the semiconductor device including the lead frame 100. Additionally, the plating layer 140a is formed on bottom surfaces of the first and second lands 145 and 147 of each of the extended leads 140. A bottom surface of the plating layer 140a, formed on the bottom surfaces of the first and second lands 145 and 147 is exposed to a lower portion of the encapsulant of the semiconductor device. The plating layer 140a of the first and second lands 145 and 147 is required to allow for the surface-mounting of the semiconductor device including the lead frame 100 to an external device. On the side surfaces of the first and second lands 145 and 147 of the extended lead 140, the plating layer 140a may be further formed. In other words, the plating layer 140a is formed on those areas of each of the extended leads 140 except for the half etched portion 143 thereof. As indicated above, the half etched portion 143 is removed to separate the first land 145 electrically from the second land 147 in the fabricating process of the semiconductor device.

As also indicated above, each normal lead 160 is formed outwardly from the die pad 110 with a predetermined pitch and is provided with the third land 165, and a half etched portion 164 on a bottom surface between the third land 165 and the frame 130. As such, the plating layer 160a of each normal lead 160 is formed on a top surface of the third land 165 and a top surface from the third land 165 to the frame 130 for wire-bonding with a semiconductor die in the fabricating process of the semiconductor device including the lead frame 100. Additionally, the plating layer 160a is formed on the lower surfaces of the third land 165 and the half etched portion 164. The plating layer 160a formed on the bottom surface of the third land 165 is exposed to a lower portion of the encapsulant of the semiconductor device. Additionally, a bottom surface of the plating layer 160a, formed on the third land 165 is used in the surface-mounting of the semiconductor device including the lead frame 100 to an external device.

Figure 3A:
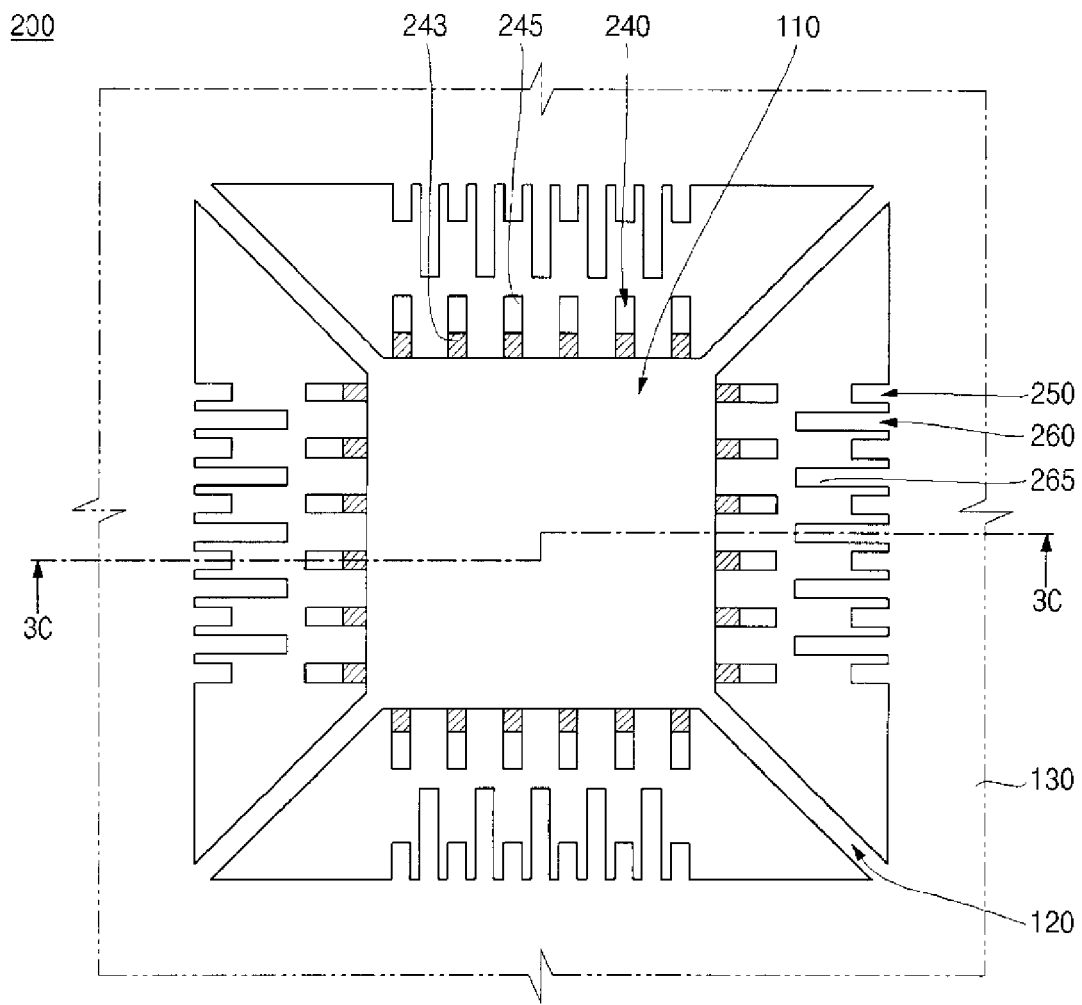
FIG. 3A is a top plan view illustrating a lead frame according to another exemplary embodiment of the present invention.
Figure 3B:
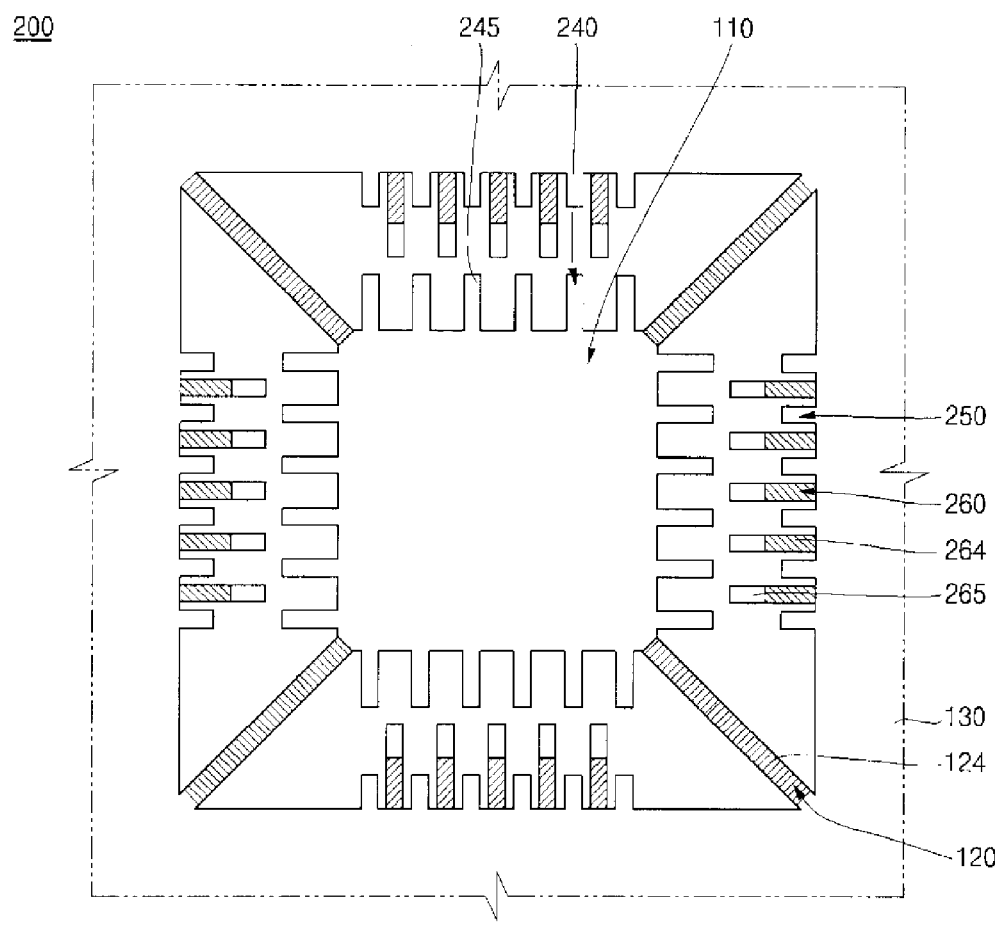
FIG. 3B is a bottom plan view of the lead frame shown in FIG. 3A.
Figure 3C:
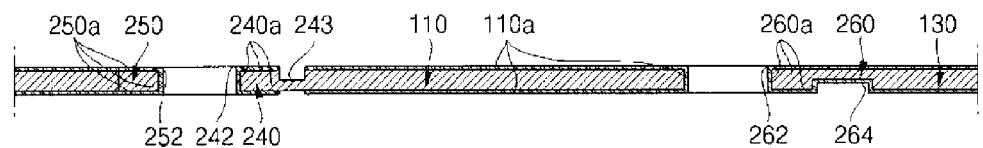
FIG. 3C is a cross-sectional view taken along line 3C-3C of FIG. 3A.

Referring to FIGS. 3A-3C, there is shown a lead frame 200 according to another exemplary embodiment of the present invention. As shown in FIGS. 3A to 3C, the lead frame 200 includes a die pad 110, a plurality of tie bars 120 formed on the die pad 110, a frame 130 connecting the tie bars 120 to each other, a plurality of projection leads 240 formed on the die pad 110, a plurality of second lands 250 formed on the frame 130 and a plurality of normal leads 260 formed on the frame 130. The lead frame 200 has the same structure as that of the lead frame 100, except for the projection leads 240, the second lands 250 and normal leads 260. Accordingly, with emphasis on the differences between the lead frames 100, 200, the projection leads 240 with a predetermined pitch are projected outwardly from respective sides of the frame 130 at a constant length. In other words, the projection leads 240 are extended perpendicularly to the sides of the die pad 110 and outwardly at a constant length.

Additionally, each of the projection leads 240 is provided with a first land 245, and a half etched portion 243 formed on a top surface between the first land 245 and the die pad 110. The half etched portion 243 is removed to separate the first land 245 electrically from the die pad 110 in the fabricating process of the semiconductor device including the lead frame 200. In addition, the half etched portion 243 is hatched in FIG. 3A. A bottom surface of the first land 245 is exposed to a lower portion of the encapsulant of the semiconductor device including the lead frame 200 and is used in surface mounting a semiconductor device including the lead frame 200 to an external device. Additionally, a plating layer 240a is formed on the bottom surface of the first land 245 to assist in such surface mounting to the external device.

Additionally, a wire bonding area 242 is formed on a top surface of the first land 245. Of course, though being explained below, the wire bonding area 242 is an area for electrically bonding conductive wires. Additionally, the plating layer 240a is formed on a top surface of the projection lead 240 so as to easily perform wire bonding. In other words, the plating layer 240a is formed on the each projection lead 140, except for upper, bottom and side surfaces of the half etched portion 243 thereof.

The plating layer 240a may be formed on a side surface of the first land 245 of the projection lead 240. The plating layer 240a may be made of any one material selected from silver (Ag), nickel (Ni)/palladium (Pd)/gold (Au), tin (Sn) or equivalent materials. The second land 250 with a predetermined pitch is extended perpendicularly from the frame 130 toward the projection lead 240 formed on the die pad 110 at a constant length. In other words, the second land 250 and the projection lead 240 are formed on the same straight line or a common axis extending perpendicularly from the die pad 110 to the frame 130. However, the second land 250 is not in contact with the projection lead 240 of the die pad 110. A bottom surface of the second land 250 is exposed to a lower portion of an encapsulant of the semiconductor device including the lead frame 200, and is surface mounted to an external device. Additionally, a plating layer 250a is formed on the bottom surface of the second land 250 for assisting in the surface mounting to the external surface.

Additionally, a wire bonding area 252 is formed on a top surface of the second land 250. Of course, though being explained below, the wire bonding area 252 is an area for electrically bonding conductive wires. A plating layer 250a may be formed on the top surface of the second land 250 so as to easily perform wire bonding. The plating layer 250a may be formed on a side surface of the second land 250. The plating layer 250a may be made of the same material as that of the plating layer 240a. Thus, the detailed explanation of the material will be omitted.

The normal leads 260 with a predetermined pitch are extended perpendicularly from the frame 130 and toward the die pad 110 at a constant length. The length of each normal lead 260 is longer than that of the second land 250, however, the normal leads 260 do not contact the die pad 110. In other words, the second lands 250 and the normal leads 260 are alternately positioned relative to each other and the length of the normal leads 260 is longer than that of the second lands 250. Additionally, each normal lead 260 is provided with a third land 265 and a half etched portion 264 formed on a bottom surface between the third land 265 and the frame 130. The half etched portion 264 is hatched in FIG. 3B. A bottom surface of the third land 265 is exposed to a lower portion of the encapsulant of the semiconductor device including the lead frame 200 and surface mounted to an external device. Additionally, a plating layer 260a is formed on the bottom surface of the third land 265 for assisting in the surface mounting to the external device.

On the top surface of the normal lead 260, a wire bonding area 262 is formed. The wired bonding area 262 extends on the top surface from the third land 265 to the frame 130. Of course, the wire bonding area 262 is an area for electrically bonding conductive wires, as explained below. A plating layer 260a is formed on the top surface of the normal lead 260 to easily perform wire bonding. The plating layer 260a may be formed on a side surface of the normal lead 260. The plating layer 260a may be made of the same material as that of the plating layer 240a. Thus, the detailed explanation of the material will be omitted.

The lead frame 200 according to the present invention, is typically integrated into a quad flat no-lead (QFN) package, and has high heatproof performance for emitting heat generated from the semiconductor die to the outside, and high electrical performance due to a short path for electrically transmitting a signal. Additionally, a downset is not formed in the lead frame 200 and thus a step is not formed therein. As a result, the size and thickness of the package including the lead frame 200 can be reduced, in comparison with a conventional lead frame package. The lead frame 200 can be fabricated by etching the half etched portion 243 in addition to the second and third lands 250 and 265 and separating a plurality of first lands 245 electrically from each other in the fabricating process of the semiconductor device including the lead frame 200. The lead frame 200 formed as described above may form a plurality of lands at low cost, in comparison with conventional lead frame fabrication methods.

Figure 4A:
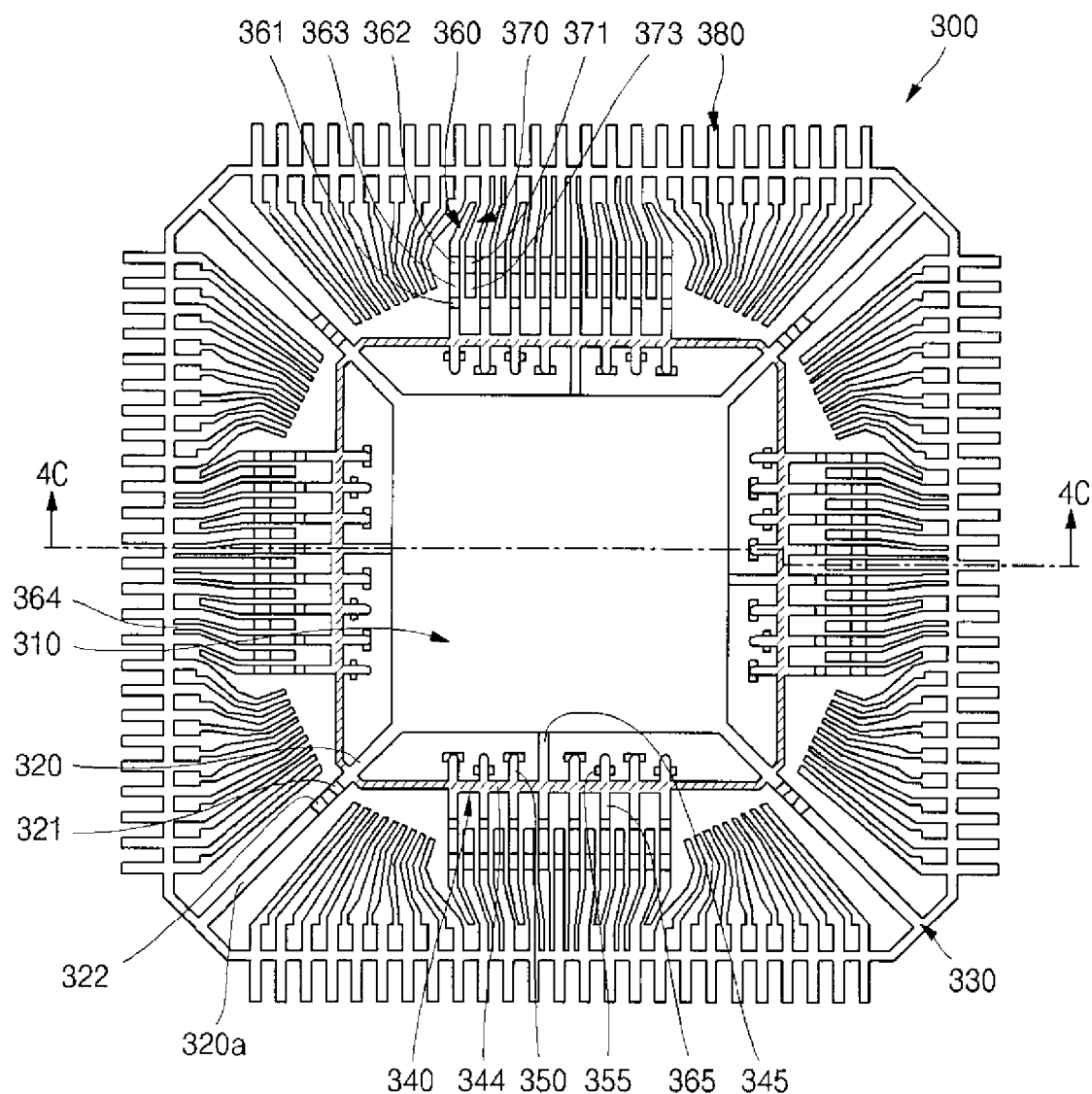
FIG. 4A is a top plan view illustrating a lead frame according to another exemplary embodiment of the present invention.
Figure 4B:
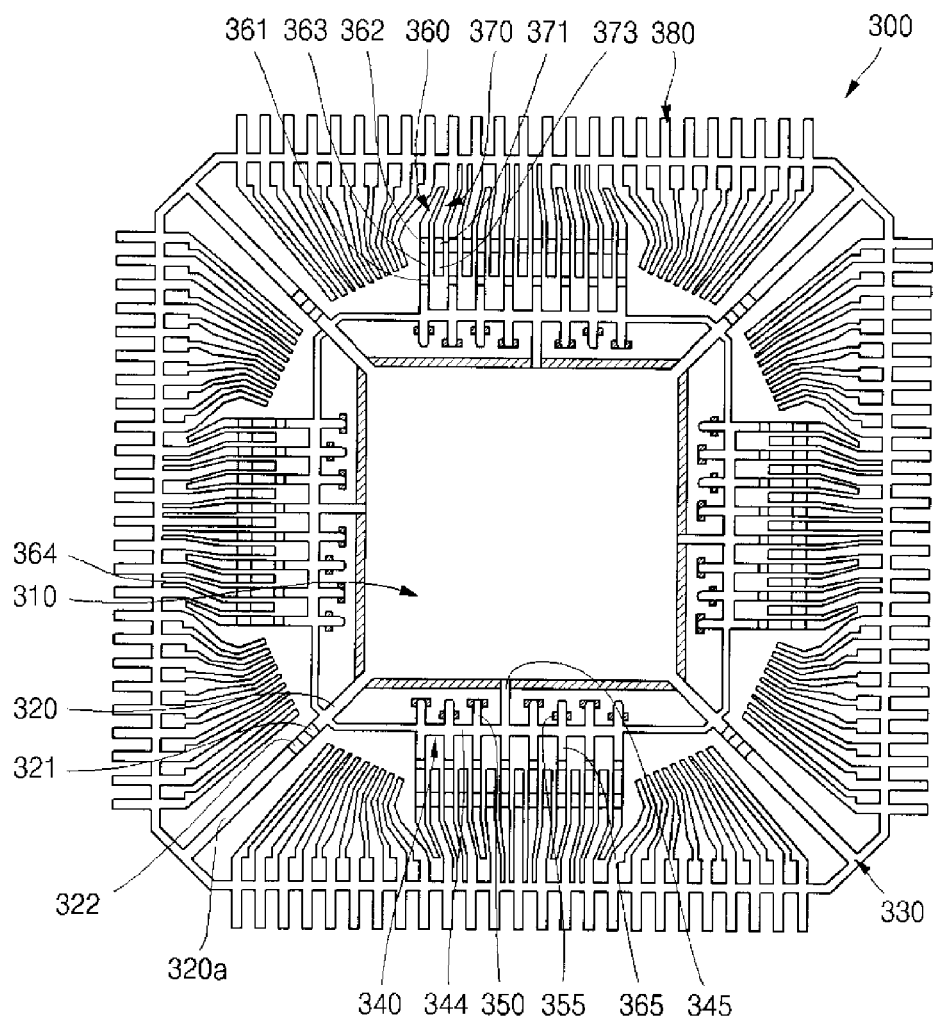
FIG. 4B is a bottom plan view of the lead frame shown in FIG. 4A.
Figure 4C:
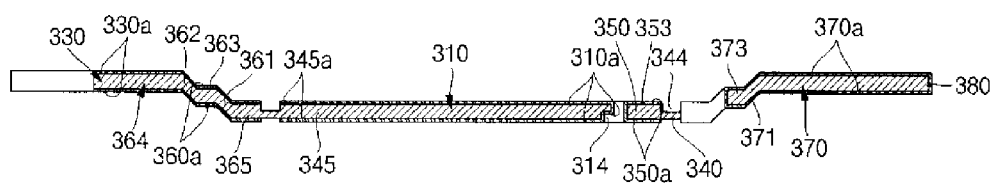
FIG. 4C is a cross-sectional view taken along line 4C-4C of FIG. 4A.

Referring now to FIGS. 4A to 4C, a lead frame 300 according to another exemplary embodiment of the present invention may include a die pad 310, a plurality of tie bars 320 formed on the die pad 310, a dambar 330 connecting the tie bars 320 to each other, a land connection bar 340 spaced from the sides of the die pad 310 and connecting the tie bars 320 to each other, a plurality of first lands 350 formed on the land connection bar 340, a plurality of extended leads 360 formed on the land connection bar 340, a plurality of normal leads 370 formed on the dambar 330 and a plurality of external leads 380 formed on the dambar 330. The die pad 310 has an approximately quadrangular plate shape with four sides and four corners. A semiconductor die is attached to the die pad 310 after an adhesive is applied to the die pad 310 in a fabrication process for a semiconductor device including the lead frame 300. The die pad 310 is exposed to a lower portion of the encapsulant of the semiconductor device including the lead frame 300. In other words, the die pad 310 is surface-mounted on an external device. A plating layer 310a may be formed on the top and bottom surfaces of the die pad 310 from any one material selected from silver (Ag), nickel (Ni)/palladium (Pd)/gold (Au), tin (Sn) or equivalent materials. Additionally, the plating layer 310a may be formed on the side surfaces of the die pad 310. A half etched portion 314 extends along each of the four sides of the die pad 310 and is recessed relative to the bottom surface thereof. The half etched portion 314 is also ultimately covered by the encapsulant of the semiconductor device including the lead frame 300. As a result, bonding the encapsulant to the die pad 310 can be improved. The half etched portion 314 of the die pad 310 is hatched in FIG. 4B.

The tie bars 320 project or protrude outwardly from respective ones of the four corners of the die pad 310 at a constant length. In other words, each of the tie bars 320 is extended outwardly from a respective corner of the die pad 310 along an imaginary diagonal line. Additionally, a first downset 321 and a second downset 322 are formed in each the tie bar 320. Accordingly, an outer area of the first downset 321 is positioned higher than the die pad 310. In other words, only an inner area of the first downset 321 formed on the tie bar 320 extends in generally coplanar relation to the die pad 310. A plating layer 320a may be formed on the top and bottom surfaces of each tie bar 320. The plating layer 320a may be made of the same material as that of the plating layer 310a. Thus, the detailed explanation of the material will be omitted. Additionally, the plating layer 320a may be formed on the side surface of each tie bar 320.

The dambar 330 connects the tie bars 320 to each other. Accordingly, the dambar 330 has an approximately quadrangular ring shape. The dambar 330 may define segments which extend in generally parallel relation to respective sides of the die pad 310. However, the dambar 330 is removed to separate the extended leads 360 electrically from the normal leads 370 in a fabrication process of a semiconductor device including the lead frame 300. A plating layer 330a may be further formed on the top and bottom surfaces of the dambar 330. The plating layer 330a may be made of the same material as that of the plating layer 310a. Thus, the detailed explanation of the material will be omitted. Additionally, the plating layer 330a may be formed on the side surface of the dambar 330.

The land connection bar 340 is spaced from the four sides and four corners of the die pad 310, and extends in generally coplanar relation to the die pad 310. In other words, the land connection bar 340 is spaced from the die pad 310 and formed to extend about the die pad 310. The land connection bar 340 also connects the tie bars 320 to each other. A half etched portion 344 is formed on the top surface of the land connection bar 340. The half etched portion 344 is removed to separate the first lands 350 electrically from the extended leads 360 in the fabrication process of the semiconductor device including the lead frame 300. Additionally, the half etched portion 344 is hatched in FIG. 4A.

Support bars 345 are further formed on the land connection bar 340, each of the support bars 345 connecting the land connection bar 340 and the die pad 310 to each other. A plating layer 345a may be further formed on the top and bottom surfaces of each of the support bars 345.

The first lands 350 of predetermined pitch are extended perpendicularly from the land connection bar 340 toward the die pad 310 at a constant length. However, each first land 350 does not contact the die pad 310. Additionally, a bottom surface of each first land 350 exposed to the lower portion of the encapsulant of the semiconductor device including the lead frame 300, and defines an area to be surface-mounted to an external device. A plating layer 350a may formed on the top, bottom and side surfaces of each first land 350 to assist with the surface-mounting to the external device.

Additionally, a wire bonding area is defined on the top surface of each first land 350. Of course, the wire bonding area 353 is an area for electrically bonding conductive wires, though being explained below. As indicated above, the plating layer 350a may be further formed on the top surface of each first land 350 to easily perform wire bonding. The plating layer 350a may also be formed on a side surface of the first land 350 as also indicated above. The plating layer 350a may be formed by the same material as that of the plating layer 310a. Thus, the detailed explanation of the material will be omitted. Additionally, the first land 350 is provided with a locking projection 355 formed on both sides or on one side of the first land 350. A half etched portion 355a is formed on the bottom surface of each locking projection 355 and covered by the encapsulant of the semiconductor device including the lead frame 300. As a result, bonding force between each first land 350 and the encapsulant can be improved. The half etched portion 355a of each locking projection 355 is hatched in FIG. 4B.

Each extended lead 360 with a predetermined pitch is extended perpendicularly from the land connection bar 340 toward the dambar 330 at a constant length. Additionally, each extended lead 360 defines a second land 365. Each second land 365 is adapted for surface mounting to an external device. In FIGS. 4A and 4B, each first land 350 is linerally aligned with a respective one of the second lands 365.

Each extended lead 360 is also provided with a first downset 361 and a second downset 362, which are sequentially formed therein. Accordingly, an outer area of the first downset 361 of each extended lead 360 is positioned higher than the die pad 310. Additionally, the second land 365 of each extended lead 360 is formed inwardly from the first downset 361 and is connected to the land connection bar 340.

Each extended lead 360 defines a wire bonding area 363 on the top surface thereof between the first downset 361 and the second downset 362. The wire bonding area 363 is formed higher than or elevated relative to the die pad 310. The wire bonding area 363 is an area for electrically bonding conductive wires, though being explained below. Additionally, a plating layer 360a is formed on the top surface of each extended lead 360 to easily perform wire bonding. The plating layer 360a may be formed by the same material as that of the plating layer 310a. Thus, the detailed explanation of the material will be omitted. The plating layer 360a may also be formed on the bottom and side surfaces of each extended lead 360.

Additionally, a tie bar portion 364 of each extended lead 360 is connected with the dambar 330. As a result, the flatness of the land connection bar 340 and the first lands 350 can be maintained. When the dambar 330 is removed in the fabrication process of the semiconductor device including the lead frame 300, the extended tie bar portions 364 are not exposed to the outside of the encapsulant. Accordingly, the extended tie bar portions 364 of the semiconductor device may be electrically coupled to an external device only through the second lands 365, like the other extended leads 365.

Each normal lead 370 with a predetermined pitch is extended perpendicularly from the dambar 330 toward the die pad 310 at a constant length. Additionally, the normal leads 370 and the extended leads 360 are alternately positioned or staggered relative to each other. Each normal lead 370 is provided with a downset 371. The downsets 371 of the normal leads 370 correspond to the second downsets 362. Moreover, each normal lead 370 is provided with a wire bonding area 373 on the top surface thereof between the downset 371 and the die pad 310. The wire bonding area 373 has the same planar shape as that of the wire bonding area 363 of each extended lead 360. Of course, the wire bonding area 373 is an area for electrically bonding conductive wires, though being explained below. Additionally, a plating layer 370a may be formed on the top surface of each normal lead 370 to easily perform wire bonding. The plating layer 370a may be made of the same material as that of the plating layer 310a. Thus, the detailed explanation of the material will be omitted. The plating layer 370a may also be formed on bottom and side surfaces of each normal lead 370.

Each external lead 380 is extended perpendicularly outward from the dambar 330 at a constant length, and is aligned with a respective one of the normal leads 370. The external leads are 380 are electrically coupled to the tie bar 320, the extended leads 360 and the normal leads 370. However, when the dambar 330 is removed in the fabrication process of the semiconductor device including the lead frame 300, the external lead 380 are electrically coupled to only respective ones of the normal lead 370. Accordingly, an electrical signal through each normal lead 370 is transmitted through the corresponding external lead 380. Each external lead 380 protrudes from a side surface of the encapsulant of the semiconductor device including the lead frame 300, and is adapted to be surface mounted or through hole mounted on an external device.

The lead frame 300 formed as described above may separate a plurality of first lands 350 electrically from a plurality of second lands 365 by etching the land connection bar 340 in the fabrication process of the semiconductor device including the lead frame 300. The lead frame 300 formed as described above may form a plurality of lands at low cost, in comparison with conventional lead frame fabrication methods.

Figure 5A:
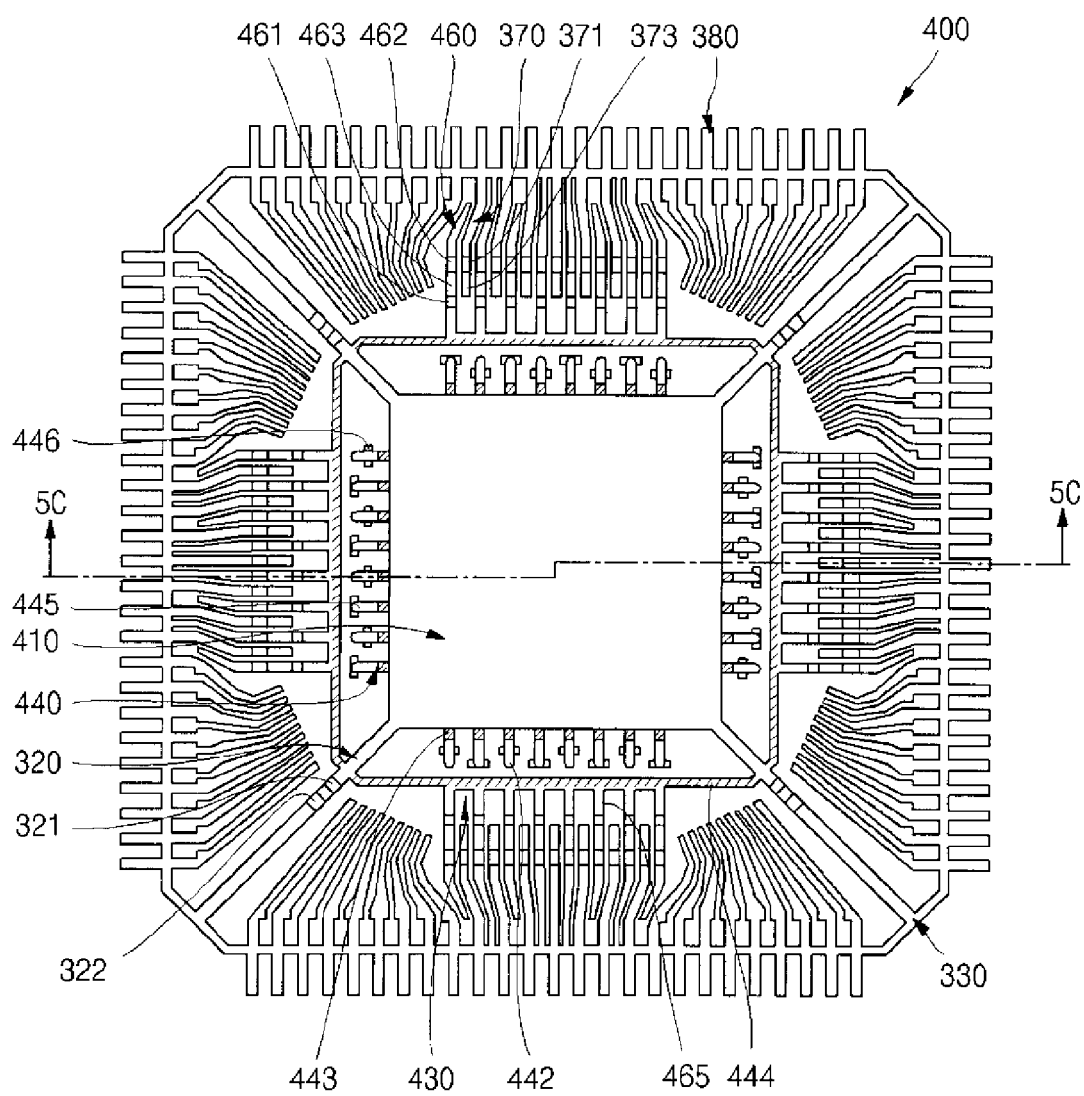
FIG. 5A is a top plan view illustrating a lead frame according to another exemplary embodiment of the present invention.
Figure 5B:
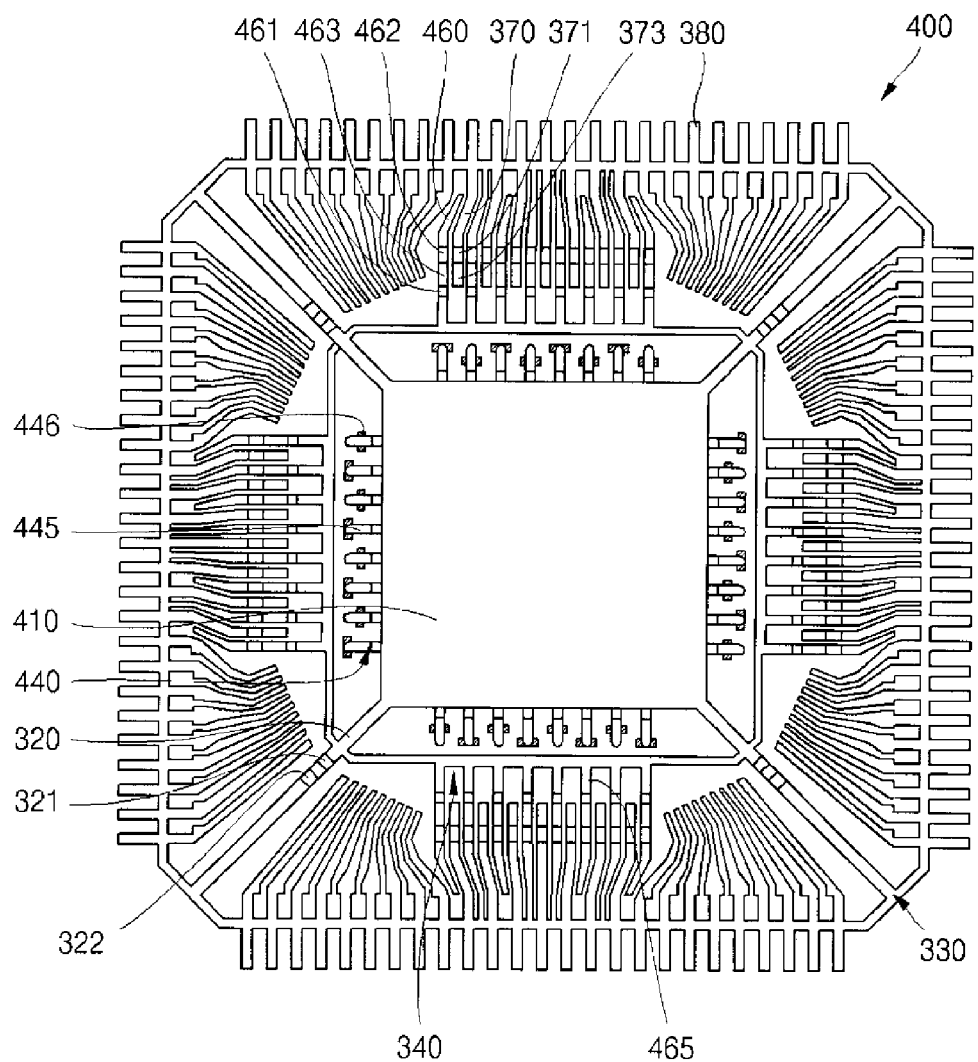
FIG. 5B is a bottom plan view of the lead frame shown in FIG. 5A.
Figure 5C:
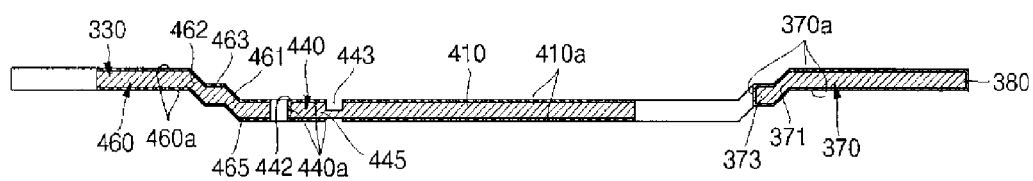
FIG. 5C is a cross-sectional view taken along line 5C-5C of FIG. 5A.

As shown in FIGS. 5A-5C, a lead frame 400 according to another exemplary embodiment of the present invention may include a die pad 410, a plurality of tie bars 320 formed on the die pad 410, a dambar 330 connecting the tie bars 320 to each other, a plurality of projection leads 440 formed on the die pad 410, a land connection bar 430 extending along and spaced from the sides of the die pad 410 and connecting the tie bars 320 to each other, a plurality of extended leads 460 with a predetermined pitch extending from the land connection bar 430 toward the dambar 330 and each including a second land 465, a plurality of normal leads 370 formed on the dambar 330, and a plurality of external leads 380 formed on the dambar 330.

The lead frame 400 has the same structure as that of lead frame 300 as described above, except for the die pad 410 and the projection leads 440. Accordingly, with emphasis on these differences, the die pad 410 has an approximately quadrangular plate shape with four sides and four corners. In the fabrication process of the semiconductor device including the lead frame 400, a semiconductor die is attached on the die pad 410 by an adhesive coated on the die pad 410. The die pad 410 is exposed to a lower portion of the encapsulant of the semiconductor device including the lead frame 400. In other words, the die pad 410 may be surface mounted on an external device. A plating layer 410a may be formed on the top and bottom surfaces of the die pad 410 from any one material selected from silver (Ag), nickel (Ni)/palladium (Pd)/gold (Au), tin (Sn) or equivalent materials. Additionally, the plating layer 410a may be formed on a side surface of the die pad 410.

The projection leads 440 with a predetermined pitch are projected outwardly from respective sides or peripheral edge segments of the die pad 410 at a constant length. In other words, the projection leads 440 extend perpendicularly outward from corresponding sides of the die pad 410 at a constant length. Additionally, each projection lead 440 is provided with a first land 445, and a half etched portion 443 formed on the top surface between the first land 445 and the die pad 410. The half etched portion 443 is removed to separate the first land 445 electrically from the die pad 410 in the fabrication process of the semiconductor device including the lead frame 400. The half etched portion 443 is hatched in FIG. 5A. The bottom surface of the first land 445 is an area exposed to a lower portion of the encapsulant of the semiconductor device including the lead frame 400, and may be surface mounted to an external device. Additionally, a plating layer 440a is formed on the bottom surface of the first land 445 for surface mounting with the external device. The plating layer may also be formed on the top and side surfaces of each first land 445.

A wire bonding area 442 is provided on the top surface of each first land 445. Of course, the wire bonding area 442 is an area for electrically bonding conductive wires, though being explained below. Additionally, as indicated above, the plating layer 440a may be formed on the top surface of each projection lead 440 to easily perform wire bonding. The plating layer 440a may be made of the same material as that of the plating layer 410a. Thus, the detailed explanation of the material will be omitted.

Additionally, a locking projection 446 may formed on both sides or one side of each first land 445. A half etched portion 446a is formed on a bottom surface of each locking projection 446 and covered by the encapsulant of the semiconductor device including the lead frame 400. As a result, the bonding force of the first land 445 and the encapsulant can be improved. The half etched portion 446a of each locking projection 446 is hatched in FIG. 5B.

Additionally, each extended lead 460 is provided with a second land 465 as indicated above. Each second land 465 is adapted to be surface mounted to an external device. The first land 445 and the second land 465 may be arranged as straight array or a staggered array. Each extended lead 460 is also provided with a first downset 461 and a second downset 462, which are sequentially formed therein. Accordingly, an outer area of the first downset 461 of each extended lead 460 is positioned higher than or elevated relative to the die pad 410.

Additionally, each extended lead 460 is provided with a wire bonding area 463 on a top surface between the first downset 461 and the second downset 462. The wire bonding area 463 is higher than or elevated relative to the die pad 410. The wire bonding area 463 is an area for electrically bonding conductive wires, though being explained below. A plating layer 460a is formed on the top surface of each extended lead 460 to easily perform wire bonding. The plating layer 460a may be made of the same material as that of the plating layer 410a. Thus, the detailed explanation of the material will be omitted. The plating layer 460a may also be formed on the bottom and side surfaces of each extended lead 460.

A half etched portion 444 is formed on a top surface of the land connection bar 430. The half etched portion 444 is removed to separate the extended leads 460 electrically from each other in the fabrication process of the semiconductor device including the lead frame 400. Additionally, the half etched portion 444 is hatched in FIG. 5A.

The lead frame 400 according to the present invention can be obtained by etching the half etched portions 443 and 444 in the fabrication process of the semiconductor device including the lead frame 400 to separate the first lands 445 and the second lands 465 electrically from each other. The lead frame 400 formed as described above may form a plurality of lands at low cost, in comparison with the existing lead frame fabrication processes.

Figure 6A:
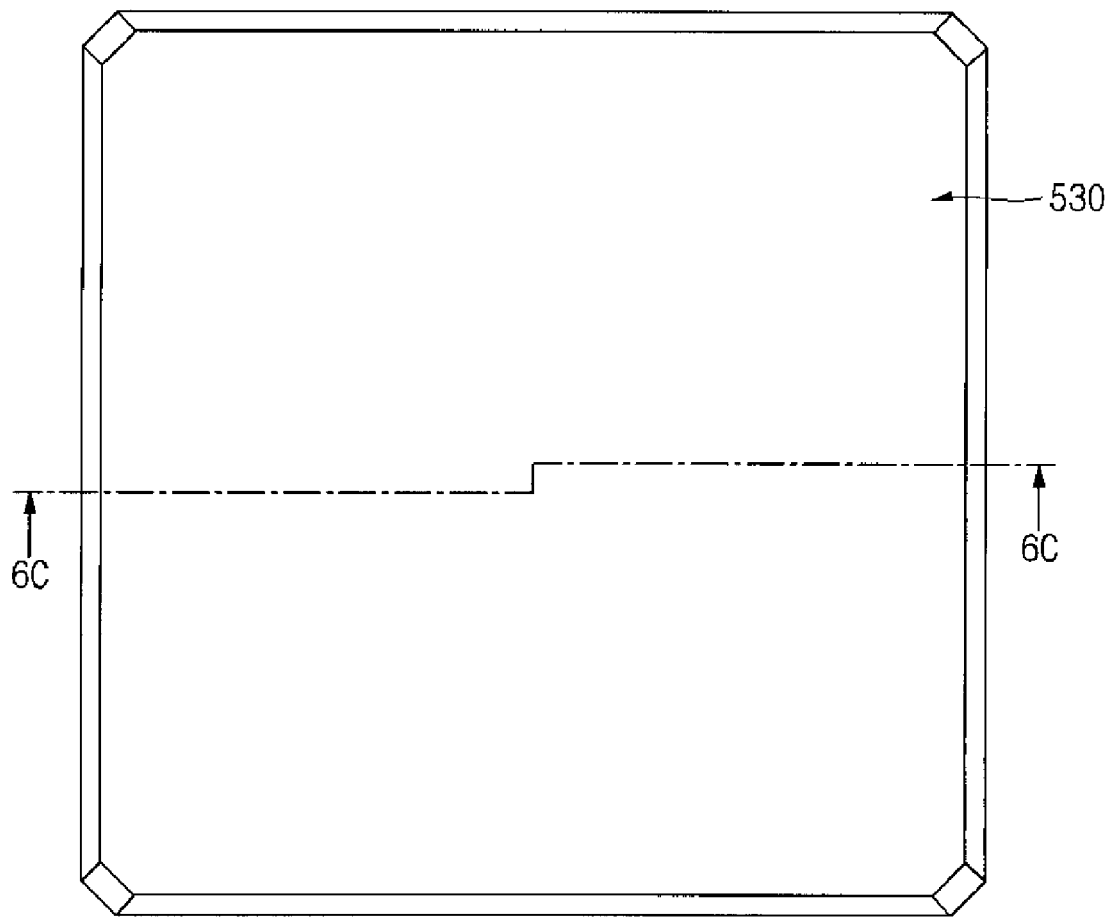
FIG. 6A is a top plan view illustrating a semiconductor device according to another exemplary embodiment of the present invention.
Figure 6B:
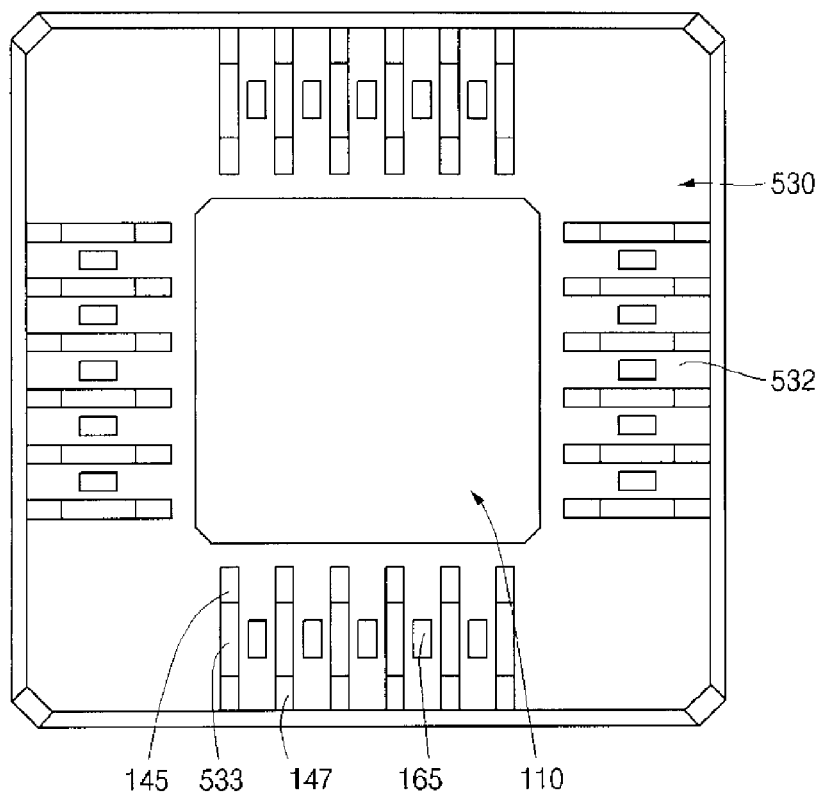
FIG. 6B is a bottom plan view of the semiconductor device shown in FIG. 6A.
Figure 6C:
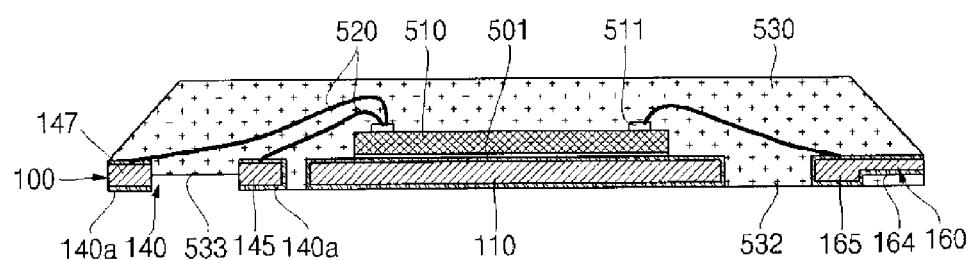
FIG. 6C is a cross-sectional view taken along line 6C-6C of FIG. 6A.

Referring now to FIGS. 6A though 6C, a semiconductor device 500 according to another exemplary embodiment of the present invention includes a lead frame 100, a semiconductor die 510, conductive wires 520 and an encapsulant 530. The lead frame 100 includes a die pad 110, a tie bar (not shown), a plurality of first and second lands 145 and 147, each corresponding pair of which is defined by an extended lead 140, and a plurality third land 165, each of which is defined by a normal lead 160. The lead frame 100 is described in detail above.

The semiconductor die 510 is attached to the die pad 110 of the lead frame 100 with an adhesive 501, and a plurality of bond pads 511 are formed on a top surface of the semiconductor die 510. Conductive wires 520 electrically couple the bond pads 511 of the semiconductor die 510 to the first lands 145 of the extended leads 140, the second lands 147 of the extended leads 140, and the third lands 165 of the normal leads 160.

The encapsulant 530 encapsulates the lead frame 100, the semiconductor die 510 and the conductive wires 520 so as to protect the lead frame 100, the semiconductor die 510 and the conductive wires 520 from the external environment. The first and second lands 145 and 147 of each extended lead 140 of the lead frame 100 and the third land 165 of each normal lead 160 are exposed to the outside through a lower portion 532 of the encapsulant 530. Additionally, the die pad 110 is exposed to the outside through the lower portion 532 of the encapsulant 530.

Additionally, a groove 533 is formed by etching a portion between the first and second lands 145 and 147 of each extended lead 140 exposed to the lower portion 532 of the encapsulant 530. The groove 533 electrically separates the first and second lands 145 and 147. When the groove 533 is formed, the plating layer 140a is formed on the bottom surfaces of the first and second lands 145 and 147. Additionally, the plating layer 140a serves as a mask. The etching may be performed alkali etching, but is not limited thereto. The etching method may separate the first and second lands 145 and 147 using the plating layer 140a formed on the lead frame 100 as a mask, without using a separate mask. As a result thereof, a plurality of lands can be formed at low cost in comparison with the conventional lead frame fabrication methods, and thus productivity can be improved.

Meanwhile, a half etched portion of each tie bar 120 of the lead frame 100 is positioned within or covered by the encapsulant in the fabrication process of the semiconductor device 500. As a result, the bonding force between the die pad 110 and the encapsulant 530 is improved. Additionally, the half etched portion 164 of each normal lead 160 of the lead frame 100 is positioned within or covered by the encapsulant 530. As a result, the bonding force of the lead frame 100 and the encapsulant 530 is improved.

Figure 7A:
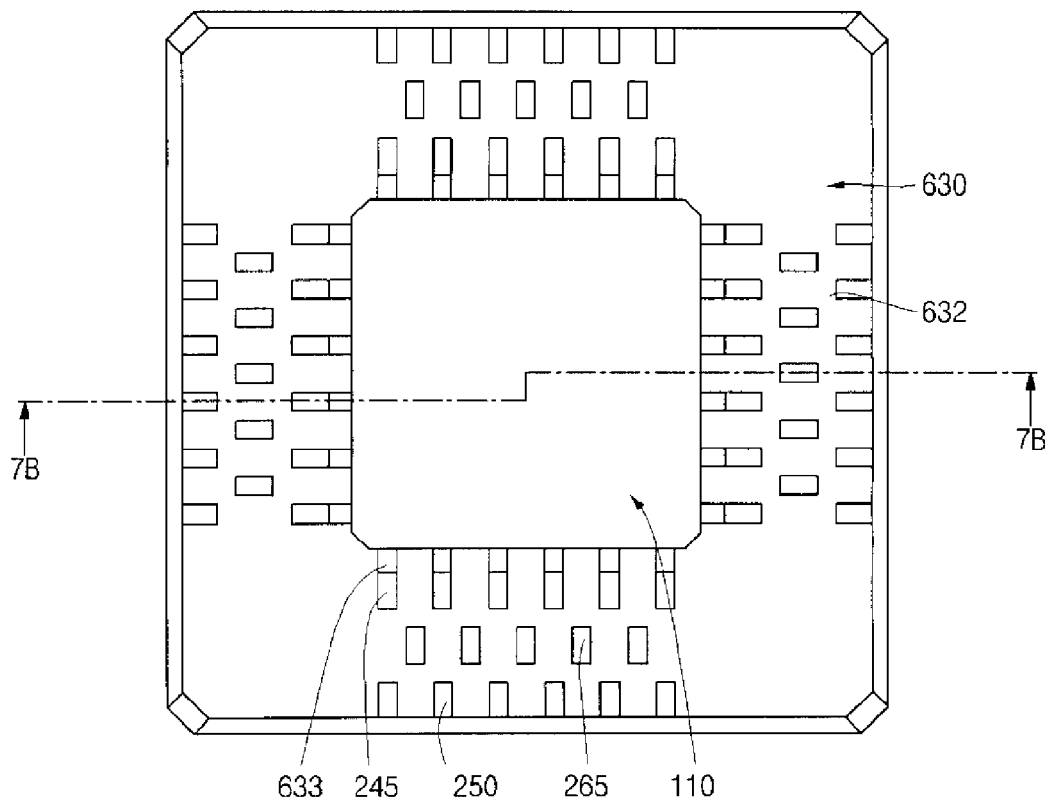
FIG. 7A is a bottom plan view illustrating a semiconductor device according to another exemplary embodiment of the present invention.
Figure 7B:
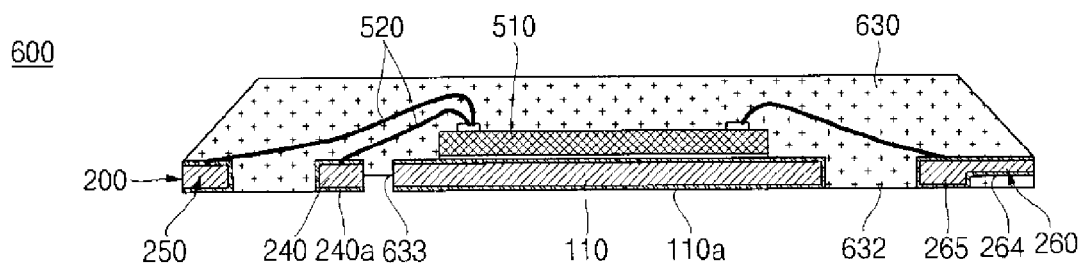
FIG. 7B is a cross-sectional view taken along line 7B-7B of FIG. 7A.

Referring now to FIGS. 7A and 7B, a semiconductor device 600 according to the present invention includes a lead frame 200, a semiconductor die 510, conductive wires 520 and an encapsulant 630. The semiconductor device 600 has the same structure as that of the semiconductor device 500 described above, except for the lead frame 200 and the encapsulant 630. Accordingly, with emphasis on these differences, the lead frame 200 includes the die pad 110, the tie bars 120, the first and second lands 245 and 250 defined by the projection leads 240 and the third lands 265 defined by the normal leads 260. The lead frame 200 is described in detail above.

The encapsulant 630 encapsulates the lead frame 200, the semiconductor die 510 and the conductive wires 520 so as to protect the lead frame 200, the semiconductor die 510 and the conductive wires 520 from the external environment. The first and second lands 245 and 250 of each projection lead 240 of the lead frame 200 and the third land 265 of each normal lead 260 are exposed to the outside through a lower portion 632 of the encapsulant 630. Additionally, the die pad 110 is also exposed to the outside through the lower portion 632 of the encapsulant 630.

Additionally, a groove 633 is formed by etching a portion between the die pad 110 exposed to the lower portion 632 of the encapsulant 630 and the first lands 245 of the projection leads 240. The groove 633 electrically separates the die pad 110 and the first lands 245. When etching to form the groove 633 is performed, the plating layers 110a and 240a are formed on the bottom surfaces of the die pad 110 and the first lands 245. Additionally, the plating layers 110a and 240a serve as masks. The etching may be performed alkali etching, but is not limited thereto. The etching method can separate the die pad 110 and the first lands 245 using the plating layers 110a and 240a formed on the lead frame 200 as masks, without using a separate mask. As such, the semiconductor device 600 can be fabricated to include the first lands 245 by separating the first lands 245 electrically from the die pad 110, in addition to the second and third lands 250 and 265. As a result, a plurality of lands can be formed at low cost in comparison with conventional lead frame fabrication methods.

Meanwhile, the half etched portion of each tie bar 120 of the lead frame 200 is positioned within or covered by the encapsulant 630 in the fabrication process for the semiconductor device 600. As a result, the bonding force between the die pad 110 and the encapsulant 630 is increased. Additionally, the half etched portion 264 of each normal lead 260 of the lead frame 200 is positioned within or covered by the encapsulant 630. As a result, the bonding force between the lead frame 200 and the encapsulant 630 is increased.

Figure 8A:
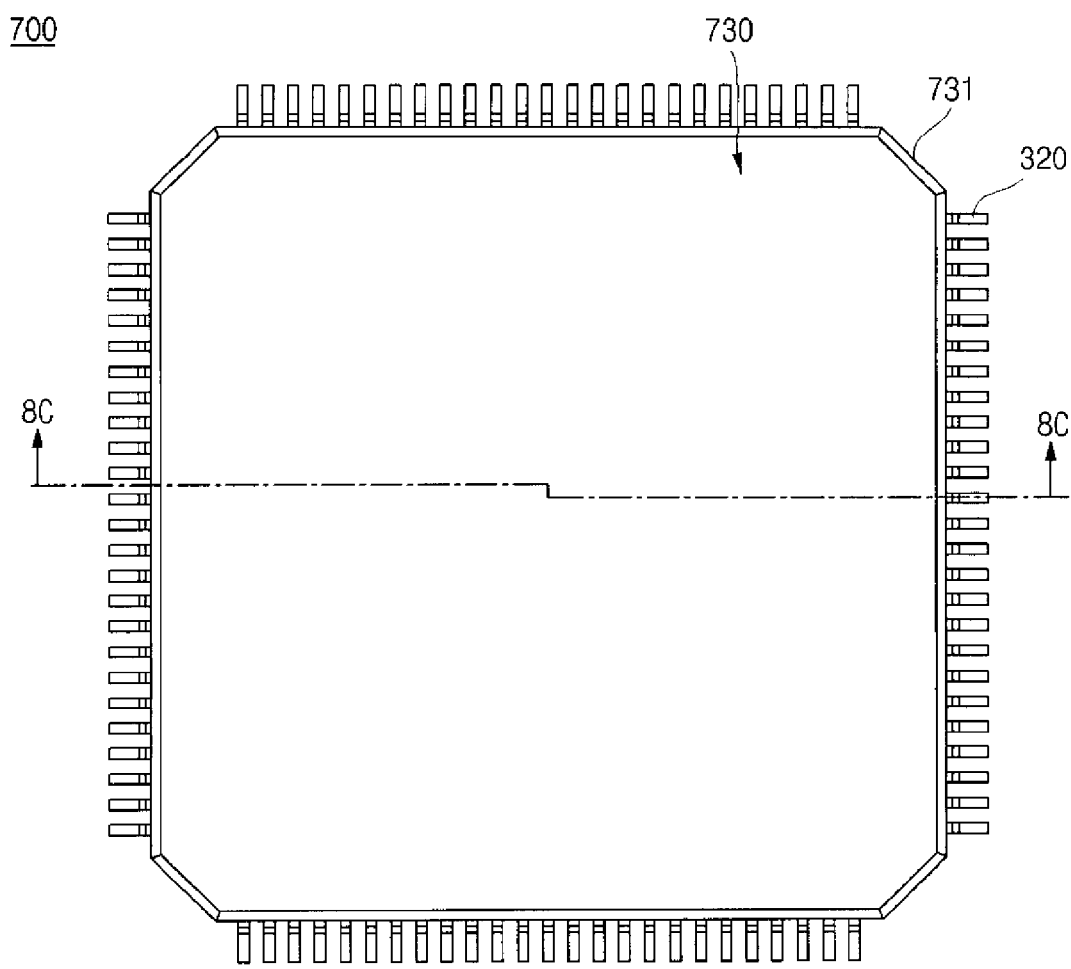
FIG. 8A is a top plan view illustrating a semiconductor device according to another exemplary embodiment of the present invention.
Figure 8B:
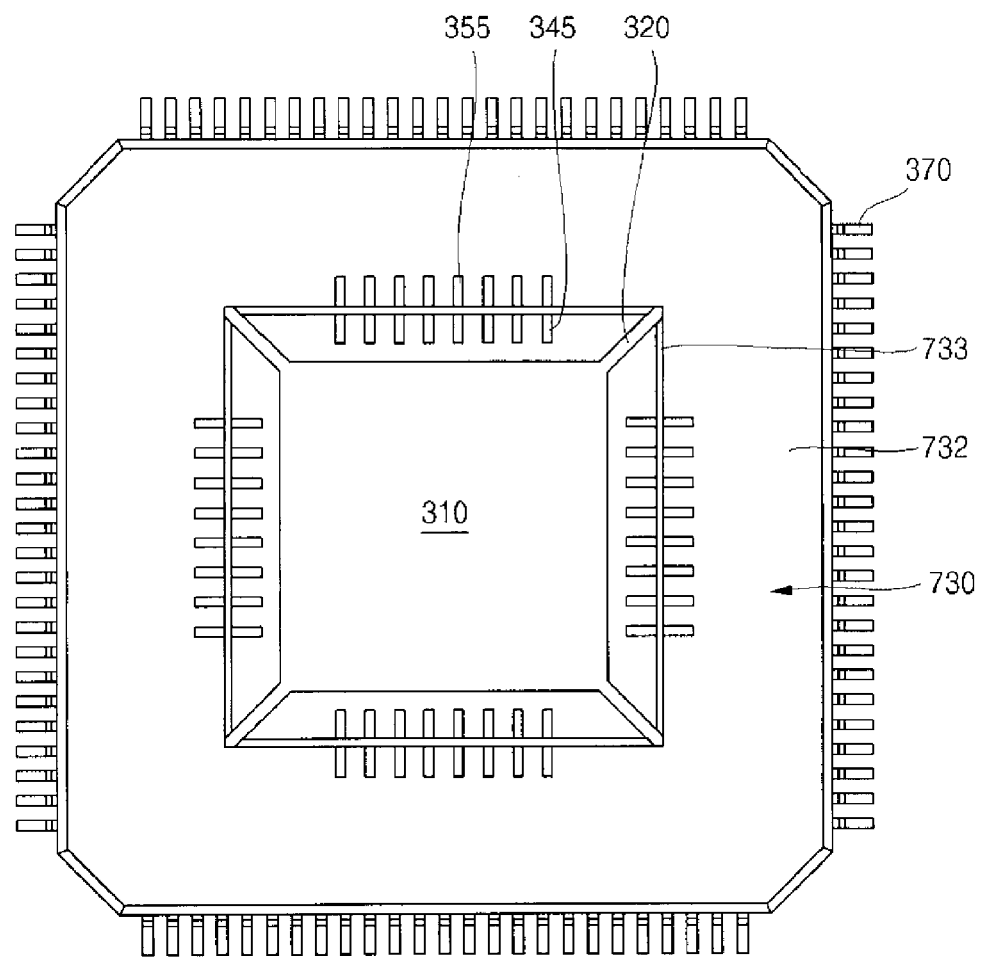
FIG. 8B is a bottom plan view of the semiconductor device shown in FIG. 8A.
Figure 8C:
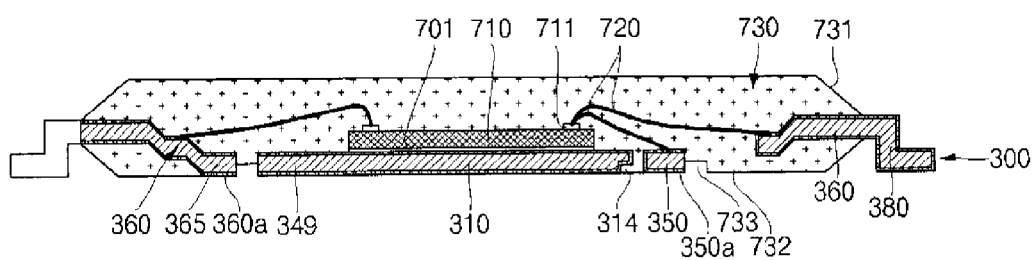
FIG. 8C is a cross-sectional view taken along line 8C-8C of FIG. 8A.

Referring now to FIGS. 8A through 8C, a semiconductor device 700 according to the present invention includes a lead frame 300, semiconductor die 710, conductive wires 720 and an encapsulant 730. The lead frame 300 includes the die pad 310, the tie bars 320, the first and second lands 350 and 365 defined by the extended leads 360, the normal leads 370 and the external leads 380. The lead frame 300 is described in detail above.

The semiconductor die 710 is attached to the die pad 310 of the lead frame 300 by the adhesive 701, and a plurality of bond pads 711 are formed on a top surface of the semiconductor die 710. The conductive wires 720 electrically couple the bond pads 711 of the semiconductor die 710 to the first lands 350, the wire bonding areas 363 of the extended leads 360, and the wire bonding areas 373 of the normal leads 370.

The encapsulant 730 encapsulates the lead frame 300, the semiconductor die 710 and the conductive wires 720 so as to protect the lead frame 300, the semiconductor die 710 and the conductive wires 720 from the external environment. The external leads 380 of the lead frame 300 are extended from a side portion 731 of the encapsulant 730 and bent to assume a gull wing configuration. The first lands 350 of the lead frame 300 and the second lands 365 of the extended leads 360 are exposed to the outside through the lower portion 732 of the encapsulant 730. Additionally, the die pad 310 and the tie bars 320 connected to the die pad 310 are also exposed to the outside through the lower portion 732 of the encapsulant 730.

A groove 733 is formed by etching a portion between the first lands 350 exposed to the lower portion 732 of the encapsulant 730 and the extended leads 360. The groove 733 electrically separates the first lands 350 and the extended leads 360. When the groove 733 is formed, the plating layers 350a and 360a may be formed on the bottom surfaces of the first lands 350 and the extended leads 360. Additionally, the plating layers 350a and 360a serve as masks. The etching may be performed by alkali etching, but is not limited thereto. The etching method can separate the first lands 350 from the extended leads 360 using the plating layers 350a and 360a formed on the lead frame 300 without using a separate mask. As a result, a plurality of lands can be formed at low cost in comparison with the conventional lead frame fabrication methods, and thus productivity can be improved.

Meanwhile, the die pad 310 provided with the half etched portion 314 improves the bonding force between the die pad 310 and the encapsulant 730 since the half etched portion 314 is positioned within or covered by the encapsulant 730. Additionally, the locking projections 355 of the first lands 350 having the half etched portions 355a increase the bonding force between the first lands 350 and the encapsulant 730 since they are also covered by the encapsulant. Additionally, a portion of each of the tie bars 320 is positioned within or covered by the encapsulant 730 in the fabrication process of the semiconductor device 700, thus further improving the bonding force between the die pad 310 and the encapsulant 730.

Figure 9A:
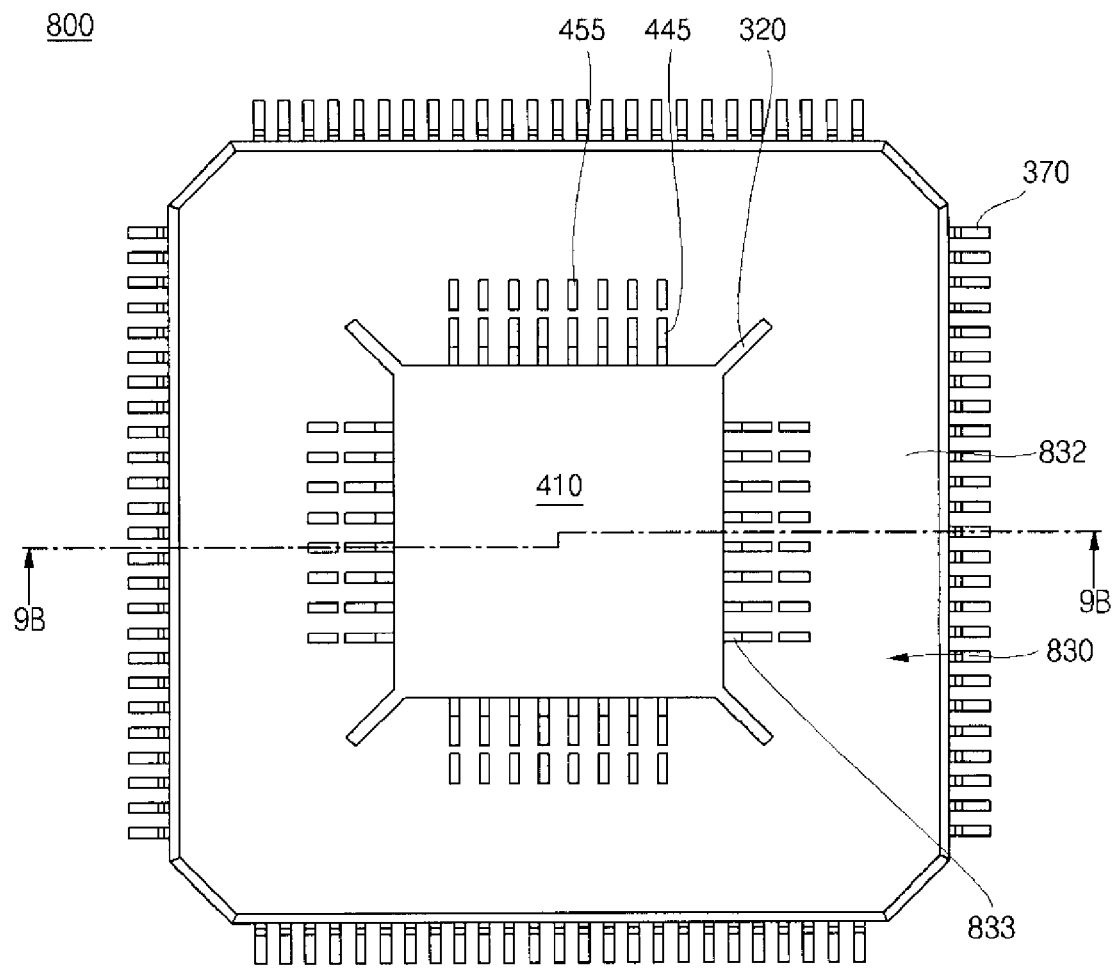
FIG. 9A is a bottom plan view illustrating a semiconductor device according to another exemplary embodiment of the present invention.
Figure 9B:
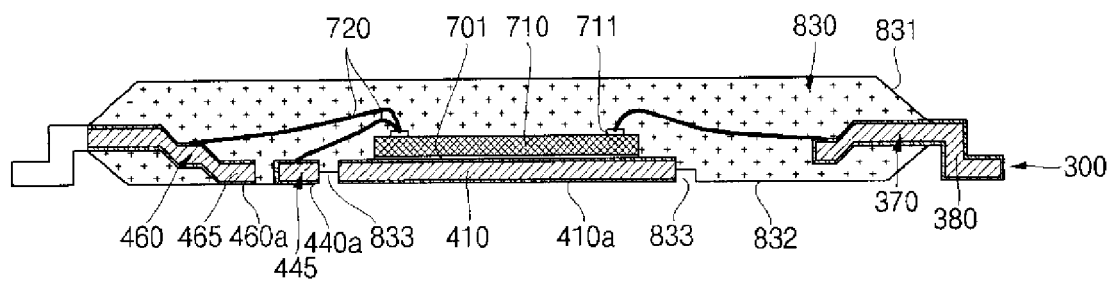
FIG. 9B is a cross-sectional view taken along a line 9B-9B of FIG. 9A.

Referring now to FIGS. 9A and 9B, a semiconductor device 800 according to the present invention includes a lead frame 400, the semiconductor die 710, the conductive wires 720 and an encapsulant 830. The semiconductor device 800 has the same structure as that of the semiconductor device 700 and the encapsulant 830.

The lead frame 400 includes a die pad 410, a tie bar 320, the first lands 445 of the projection leads 440, the second lands 465 of the extended leads 460, the normal leads 370 and the external leads 380. The lead frame 400 is described in detail above. The encapsulant 830 encapsulates the lead frame 400, the semiconductor die 710 and the conductive wires 720 so as to protect the lead frame 400, the semiconductor die 710 and the conductive wires 720 from the external environment. The external leads 380 of the lead frame 400 are extended from a side portion of 831 of the encapsulant 830 at a predetermined length, and are bent to impart a gull wing configuration thereto. The first and second lands 445 and 465 of the lead frame 400 are exposed to the outside through a lower portion 832 of the encapsulant 830. Additionally, the die pad 410 and the tie bars 320 connected to the die pad 410 are also exposed to the outside through the lower portion 832 of the encapsulant 830.

Additionally, a groove 833 is formed by etching a portion between the die pad 410 and the first lands 445 exposed to the lower portion 832 of the encapsulant 830. The groove 833 is formed to electrically separate the die pad 410 and the first lands 445 from each other. When etching for forming the groove 833 is performed, the plating layers 410a and 440a are formed on the bottom surfaces of the die pad 400 and the first lands 445. Additionally, the plating layers 410a and 440a serve as masks. The etching may be performed by alkali etching, but is not limited thereto. The etching method can separate the die pad 410 from the first lands 445 using the plating layers 410a and 440a formed on the lead frame 400 as masks without using a separate mask. As such, the semiconductor device 800 can be fabricated to include the first lands 445 in addition to the second lands 465 by separating the first lands 445 electrically from the die pad 410. As a result, a plurality of lands can be formed at low cost in comparison with conventional lead frame fabrication methods.

Meanwhile, the locking projection of each first land 445 having the half etched portion is positioned within or covered by the encapsulant 830. As a result, the bonding force between the first lands 445 and the encapsulant 830 is improved. Additionally, a portion of each of the tie bars 320 is positioned within or covered by the encapsulant 830 in the process of fabricating the semiconductor device 800. As a result, the bonding force between the die pad 410 and the encapsulant 830 is further increased.

Figure 10:
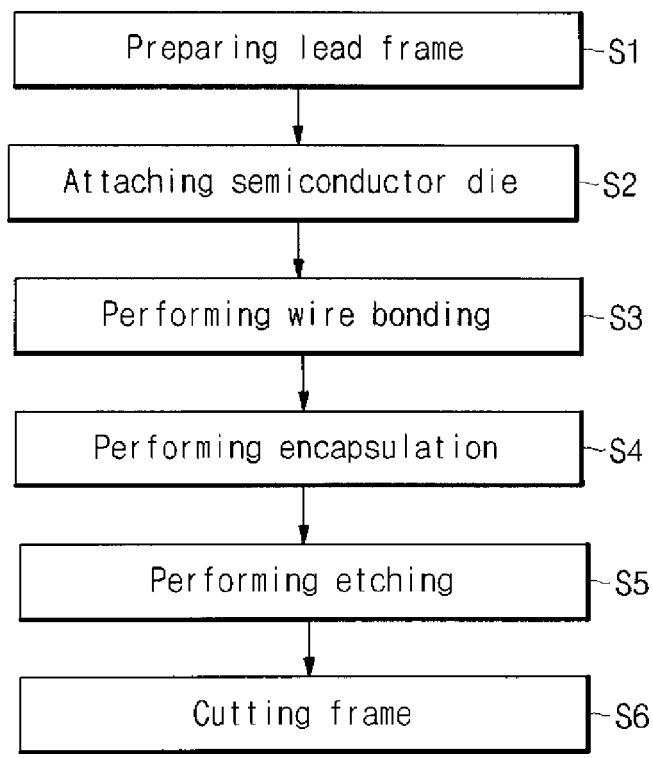
FIG. 10 is a flow chart illustrating an exemplary fabrication method for the semiconductor device shown in FIGS. 6A-6C; and, FIGS. 11A to 11J are views illustrating an exemplary fabrication method for the semiconductor device shown in FIGS. 6A-6C.

Referring now to FIG. 10, a fabrication method of a semiconductor device according to the present invention includes the steps of preparing a lead frame (S1), attaching a semiconductor die (S2), performing wire bonding (S3), performing encapsulation (S4), performing etching (S5) and cutting a frame (S6).

Figure 11A:
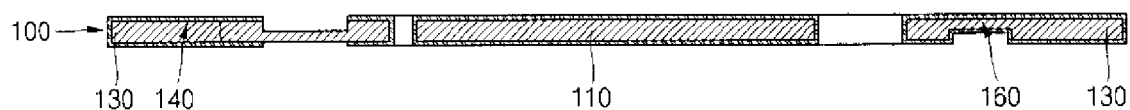

As shown in FIG. 11A, in the step of preparing the lead frame (S1), a lead frame 100 is prepared including a die pad 110, a plurality of tie bars (not shown) formed on the die pad 110, a frame 130 connecting the tie bars to each other, a plurality of extended leads 140 formed on the frame 130 and a plurality of normal leads 160 formed on the frame 130. The structure of the lead frame 100 is explained in detail above. Thus, the detailed explanation will be omitted.

Figure 11B:
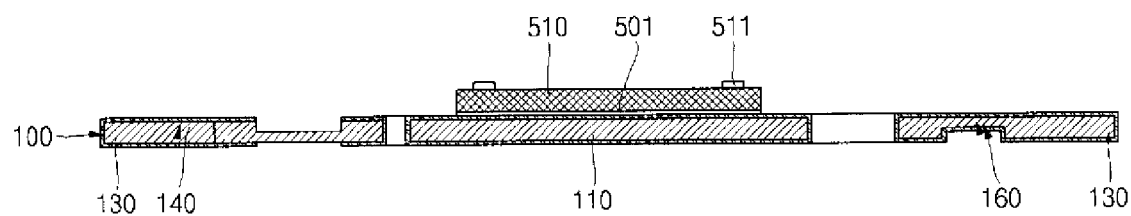

As shown in FIG. 11B, in the step of attaching the semiconductor die (S2), the semiconductor die 510 on which a plurality of bond pads 511 are formed on the top surface of the semiconductor die 510 is attached to the die pad 110 of the lead frame 100 using an adhesive 501. The adhesive 501 may be made of any one material selected from a common liquid epoxy adhesive, a contacting film, a contacting tape and equivalent materials, but is not limited thereto.

Figure 11C:
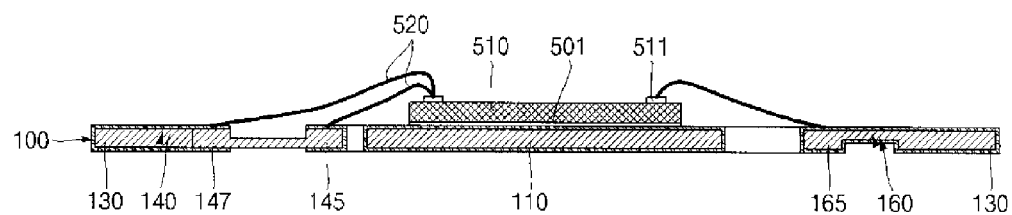
Figure 11D:
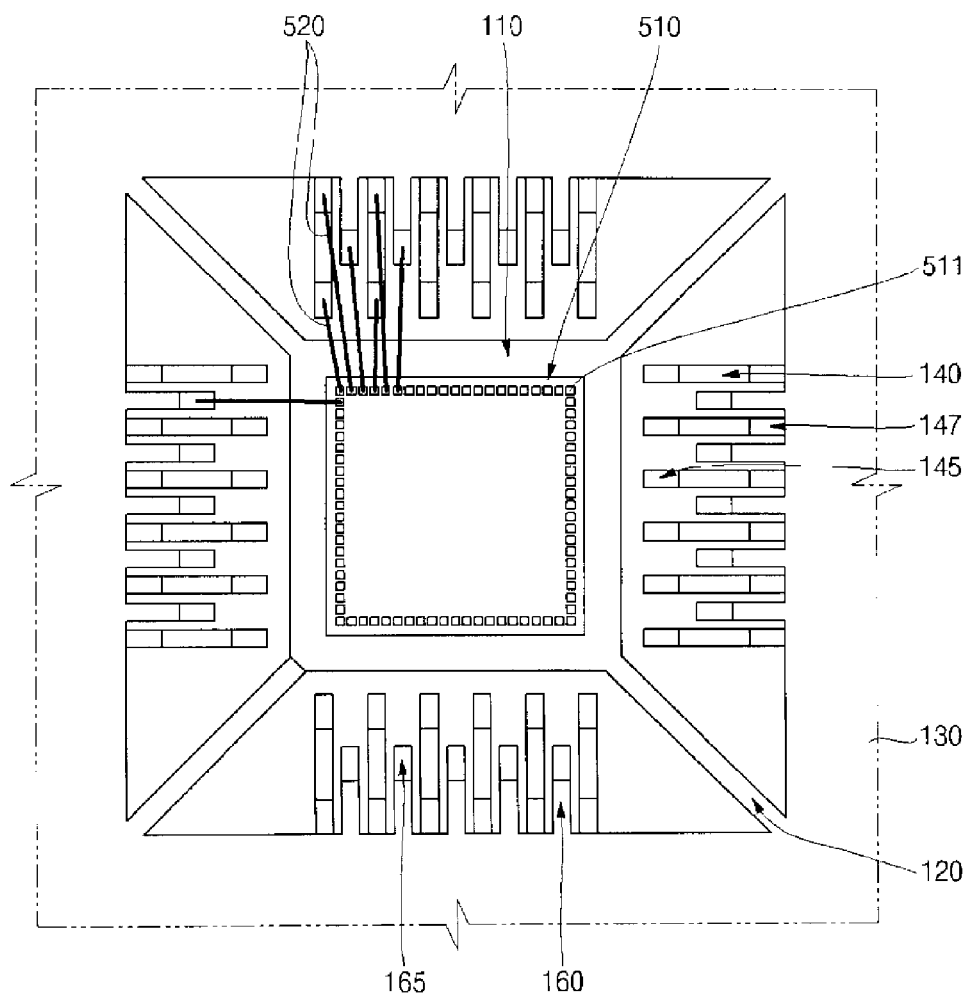

As shown in FIGS. 11C to 11D, in the step of performing wire bonding (S3), the semiconductor die 510 is electrically coupled to the lead frame 100 using the conductive wires 520. In other words, the bond pads 511 of the semiconductor die 510 are electrically coupled to the first lands 145 of the extended leads 140, the second lands 147 of the extended leads 140, and the normal leads 160. The conductive wires 520 is bonded to the wire bonding areas provided on the extended leads 140 and the normal leads 160.

Figure 11E:
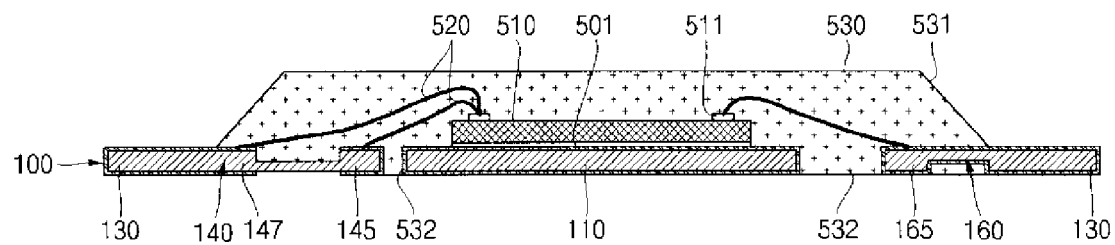
Figure 11F:
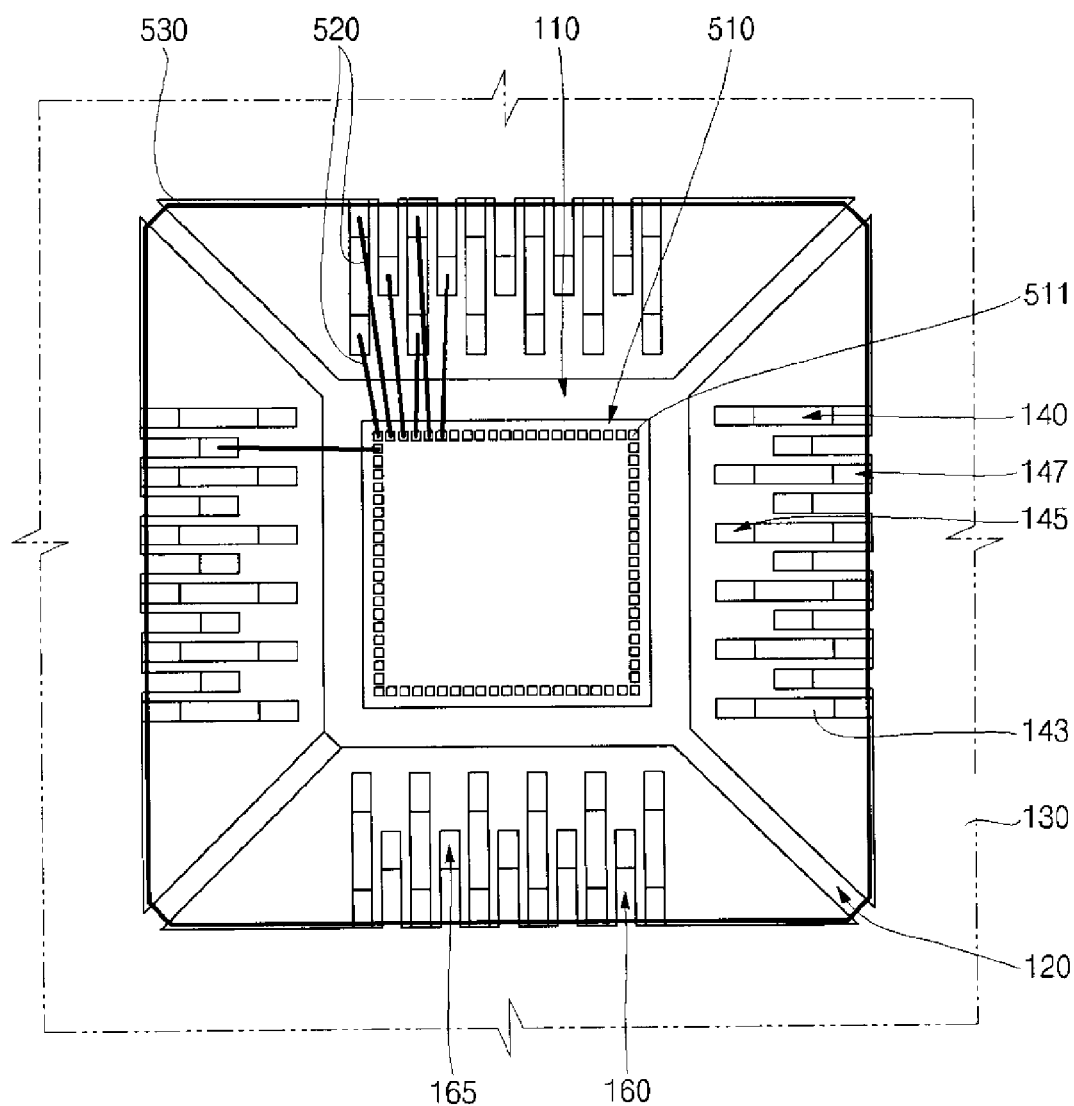

As shown in FIGS. 11E and 11F, in the step of performing encapsulation (S4), the lead frame 100, the semiconductor die 510 and the conductive wires 520 are encapsulated using the encapsulant 530. The encapsulation is to be performed in an inner area of the frame 130 formed on the lead frame 100. In other words, the frame 130 is to be exposed to the outside through the side portion 531 of the encapsulant 530. Additionally, the encapsulation is performed to expose a lower surface of the die pad 110 of the lead frame 100, a partial area of the tie bars 120 connected to the die pad 110, the extended leads 140, and the third lands 165 provided by the normal leads 160 to the outside. In other words, the die pad 110, the partial areas of the tie bars 120 connected to the die pad 110, the extended lead 140a and the third land 165 are to be exposed to the outside through the lower portion 532 of the encapsulant 530.

Figure 11G:
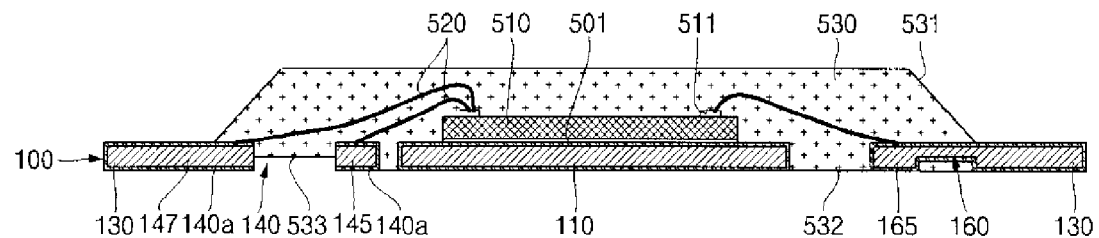
Figure 11H:
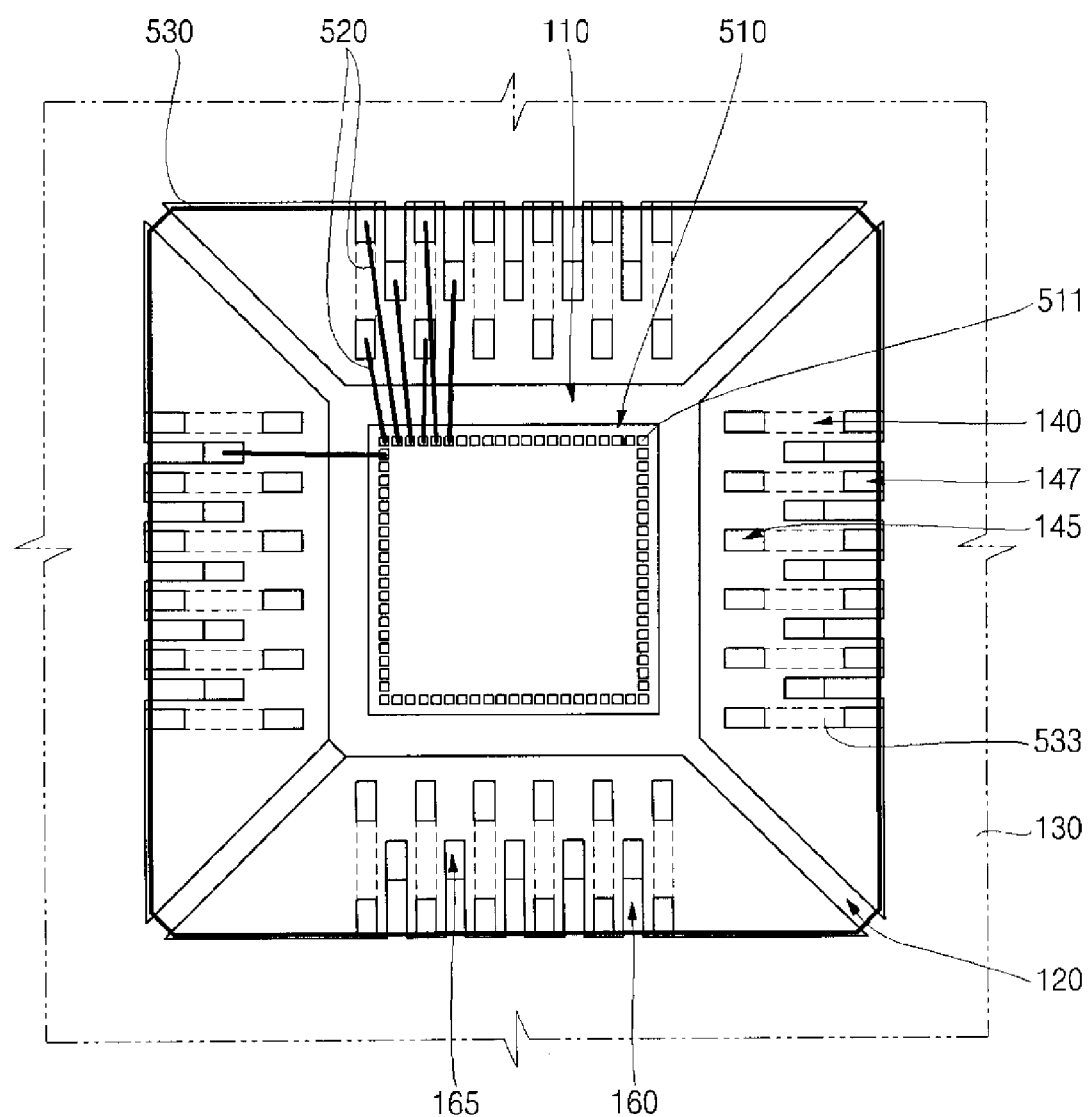

As shown in FIGS. 11G and 11H, in the step of performing etching (S5), a half etched portion provided on the extended leads 140 and exposed to the lower portion 532 of the encapsulant 530 is etched. At this time, the plating layer 140a is formed on the bottom surfaces of the first and second lands 145 and 147 of the extended leads 140 being exposed to the lower portion 532 of the encapsulant 530. Additionally, the plating layer 140a serves as a mask. Thus, only the half etched portion is etched. The half etched portion is removed by etching and thus a groove 533 is formed in the lower portion 532 of the encapsulant 530 at a constant depth. The formation of the groove 533 enables the first and second lands 145 and 147 provided on each extended lead 140 to be electrically independent of each other. The method for forming the groove 533 may be performed by alkali etching, but is not limited thereto. The etching method may separate the first land 145 from the corresponding second land 147 using the plating layer 140a formed on the lead frame 100 as a mask, without using a separate mask. As a result thereof, a plurality of lands can be formed at low cost in comparison with conventional lead frame fabrication methods.

Figure 11I:
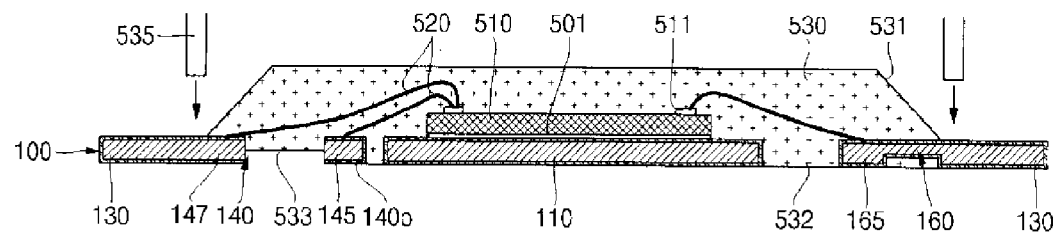
Figure 11J:
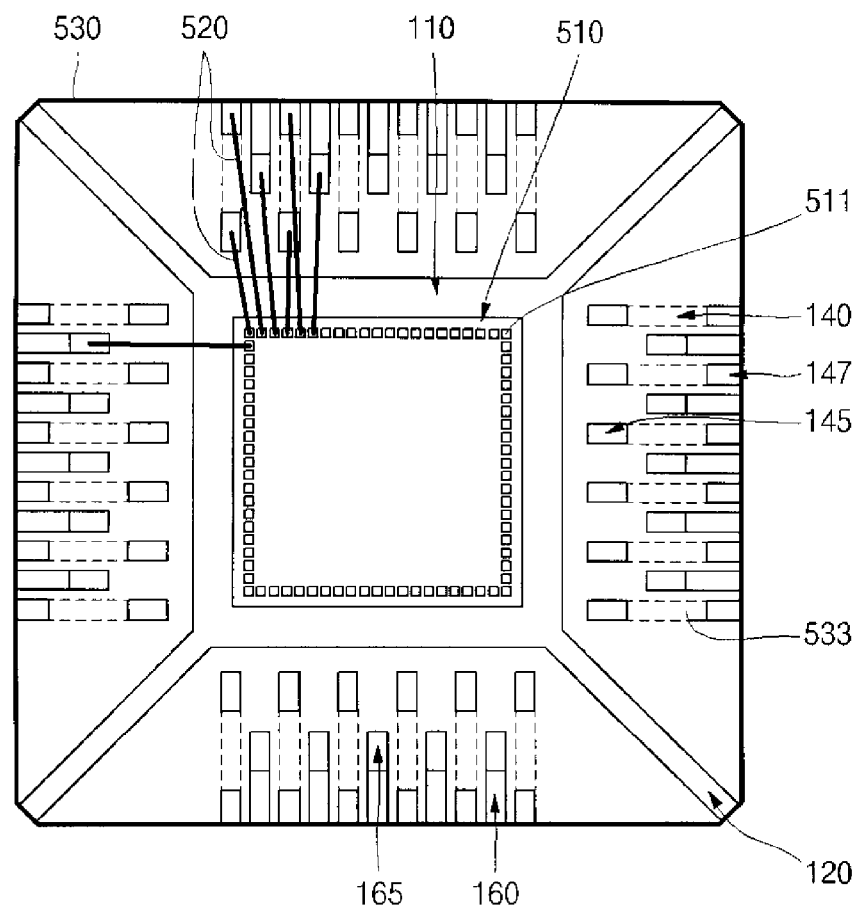

As shown in FIGS. 11I and 11J, in the step of cutting the frame (S6), the frame 130 connected to the tie bars 120, the extended leads 140 and the normal leads 160 is cut and thus the frame 130 and the semiconductor device 500 are separated from each other. As a result, the tie bars 120, the extended leads 140 and the normal leads 160 are electrically independent, respectively. In other words, the frame 130 positioned outside of the encapsulant 530 is cut and separated using a frame cutting tool 535. Additionally, in the step of cutting the frame (S6), projection areas of the tie bars 120, the extended leads 140 and the normal leads 160 which are protrude from the side portion 531 of the encapsulant 530 are removed.

Meanwhile, ink marking or laser marking may be performed on the surface of the encapsulant 530 between the step of performing encapsulation (S4) and the step of cutting the frame (S5). Additionally, the plating layer is formed on the lead frame 100, and thus a process for plating nickel (Ni)/gold (Au), Ni/Pd/Au, or tin (Sn) on the lands 145, 147 and 165 exposed to an outer side of the encapsulant 530 will be completed.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A lead frame, comprising:
   a die pad;
   a plurality of tie bars extending outwardly from the die pad;
   a frame connecting the tie bars to each other;
   a plurality of extended leads extending from the frame toward the die pad at a predetermined pitch, each of the extended leads being of a first length and including first and second lands spaced from the die pad at a predetermined distance, each of the extended leads further having opposed top and bottom surfaces and a half etched portion which is formed between the first and second lands only on the top surface thereof; and
   a plurality of normal leads extending from the frame toward the die pad at a predetermined pitch, each of the normal leads being of a second length which is less than the first length and including a third land spaced from the die pad at a predetermined distance, each of the normal leads further having opposed top and bottom surfaces and a half etched portion which is formed between the third land and the frame only on the bottom surface thereof.

2. The lead frame of claim 1, wherein a plating layer is formed on the die pad, the first and second lands of the extended leads, the normal leads, the tie bars and the frame.

3. The lead frame of claim 2, wherein the plating layer covers the entirety of the die pad, each of the normal leads, and each of the tie bars.

4. The lead frame of claim 1, wherein each of the extended leads is positioned between a corresponding pair of the normal leads.

5. The lead frame of claim 2, wherein the plating layer covers the entirety of the first and second lands of each of the extended leads.

6. A lead frame, comprising:
a die pad;
a plurality of tie bars extending outwardly from the die pad;
a frame connecting the tie bars to each other;
a plurality of projection leads extending from the die pad at a predetermined pitch, each of the projection leads including a first land, opposed top and bottom surfaces and a half etched portion which is formed between the first land and the die pad only on the top surface thereof;
a plurality of second lands extending from the frame toward the die pad at a predetermined pitch, each of the second lands being of a first length; and
a plurality of normal leads extending from the frame toward the die pad at a predetermined pitch, each of the normal leads being of a second length which exceeds the first length and including a third land spaced from the die pad at a predetermined distance, each of the normal leads further having opposed top and bottom surfaces and a half etched portion which is formed between the third land and the frame only on the bottom surface thereof.

7. The lead frame of claim 6, wherein a plating layer is formed on the die pad, the first and second lands of the projection leads, the normal leads, the tie bars and the frame.

8. The lead frame of claim 7, wherein the plating layer covers the entirety of each of the normal leads, each of the second lands, and each of the tie bars.

9. The lead frame of claim 6, wherein the projection leads are linearly aligned with respective ones of the second lands.

10. The lead frame of claim 7, wherein the plating layer covers the entirety of the first land of each of the projection leads.

11. A lead frame, comprising:
a die pad;
a plurality of tie bars extending outwardly from the die pad;
a dambar connecting the tie bars to each other;
a land connection bar extending about the die pad in spaced relation thereto and connecting the tie bars to each other;
a plurality of first lands extending from the land connection bar toward the die pad at a predetermined pitch;
a plurality of extended leads extending from the land connection bar toward the dambar at a predetermined pitch, each of the extended leads including a second land;
a plurality of normal leads extending from the dambar toward the die pad at a predetermined pitch, the normal leads alternating with the extended leads; and
a plurality of external leads extending outwardly from the dambar at a constant length, each of the external leads being aligned with a respective one of the normal leads.

12. The lead frame of claim 11, wherein the land connection bar has top and bottom surfaces and a half etched portion which is formed on the top surface thereof.

13. The lead frame of claim 11, wherein a plating layer is formed on the die pad, the first lands, the extended leads, the normal leads, the tie bars, the dambar and the external leads.

14. The lead frame of claim 11, wherein a downset is formed in each of the tie bars, the extended leads and the normal leads.

15. The lead frame of claim 11, wherein each first land is linearly aligned with a respective one of the second lands.

16. A lead frame, comprising:
a die pad;
a plurality of tie bars extending outwardly from the die pad;
a dambar connecting the tie bars to each other;
a plurality of projection leads extending from the die pad toward the dambar at a predetermined pitch, each of the projection leads including a first land;
a land connection bar extending about the die pad in spaced relation thereto and connecting the tie bars to each other;
a plurality of extended leads extending from the land connection bar toward the dambar at a predetermined pitch, each of the extended leads being of a first length and including a second land;
a plurality of normal leads extending from the dambar toward the die pad at a predetermined pitch, each of the normal leads being of a second length which exceeds the first length, the normal leads further alternating with the extended leads; and
a plurality of external leads extending outwardly from the dambar at a constant length, each of the external leads being aligned with a respective one of the normal leads.

17. The lead frame of claim 16, wherein each of the projection leads has top and bottom surfaces and a half etched portion which is formed between the first land and the die pad on the top surface thereof.

18. The lead frame of claim 16, wherein a plating layer is formed on the die pad, the first land of each of the projection leads, the extended leads, the normal leads, the tie bars, the dambar and the external leads.

19. The lead frame of claim 16, wherein a downset is formed in each of the tie bars, the extended leads and the normal leads.

20. The lead frame of claim 16, wherein each first land is linearly aligned with a respective one of the second lands.

* * * * *